(12) United States Patent
Nelson et al.

(10) Patent No.: US 7,851,380 B2
(45) Date of Patent: Dec. 14, 2010

(54) PROCESS FOR ATOMIC LAYER DEPOSITION

(75) Inventors: Shelby F. Nelson, Pittsford, NY (US);
David H. Levy, Rochester, NY (US);
Lyn M. Irving, Rochester, NY (US);
Peter J. Cowdery-Corvan, Webster, NY (US); Diane C. Freeman, Pittsford, NY (US); Carolyn R. Ellinger, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 359 days.

(21) Appl. No.: 11/861,491

(22) Filed: Sep. 26, 2007

(65) Prior Publication Data

US 2009/0081842 A1    Mar. 26, 2009

(51) Int. Cl.
*H01L 21/31* (2006.01)
(52) U.S. Cl. .............. 438/763; 257/E21.409; 257/E21.171
(58) Field of Classification Search ........... 438/763; 257/E21.171, E21.409
See application file for complete search history.

(56) References Cited

U.S. PATENT DOCUMENTS

| | | | |
|---|---|---|---|
| 4,413,022 A | 11/1983 | Suntola et al. | |
| 4,430,149 A * | 2/1984 | Berkman | ............ 117/97 |
| 6,821,563 B2 | 11/2004 | Yudovsky | |
| 7,265,003 B2 * | 9/2007 | Hoffman et al. | ............ 438/149 |
| 2005/0084610 A1 | 4/2005 | Selitser | |
| 2006/0003485 A1 * | 1/2006 | Hoffman et al. | ............ 438/73 |
| 2006/0244107 A1 | 11/2006 | Sugihara et al. | |
| 2007/0128858 A1 * | 6/2007 | Haukka et al. | ............ 438/656 |
| 2007/0134919 A1 * | 6/2007 | Gunji et al. | ............ 438/680 |
| 2008/0296567 A1 * | 12/2008 | Irving et al. | ............ 257/43 |

OTHER PUBLICATIONS

S.J. Lim et al., "The application of atomic layer deposition for transparent thin film transistor" IEEE Nanotechnology Materials and Devices Conference, 2006. NMDC 2006 Oct. 22, 2006 pp. 634-635.
E.J. Egerton et al., "P-Type doping utilizing nitrogen and Mn doping of ZnO using MOCVD for ultraviolet lasers and spintronic applications" J. Electronic Materials, vol. 34, No. 6, 2005, pp. 949-952.
B.J. Kwon et al., "Optical investigation of p-type ZnO epilayers doped with different phosphorus concentrations by radio-frequency magnetron sputtering" Applied Physics Letters. vol. 91, No. 6, Aug. 6, 2007, pp. 061903-1-061903.
C. Bundesmann et al, "Raman scattering in ZnO thin films doped with Fe, Sb, Al, Ga, and Li", Applied Physics Letters, vol. 83, No. 10, Sep. 8, 2003, whole document.

(Continued)

*Primary Examiner*—Charles D Garber
*Assistant Examiner*—Stanetta D Isaac
(74) *Attorney, Agent, or Firm*—J. Lanny Tucker; Chris P. Konkol

(57) ABSTRACT

The present invention relates to a process of making thin film electronic components and devices, such as thin film transistors, environmental barrier layers, capacitors, insulators and bus lines, where most or all of the layers are made by an atmospheric atomic layer deposition process.

23 Claims, 27 Drawing Sheets

OTHER PUBLICATIONS

Jianhua Hu et al., "Textured fluorine-doped ZnO films by atmospheric pressure chemical vapor deposition and their use in amorphous silicon solar cells", Solar Cells, vol. 30, 1/4, May 30, 1991, pp. 437-450.

X.L. Chen et al, "Boron-doped zink oxide thin films for large-area solar cells grown by metal organic chemical vapor deposition" Thin Solid Films, vol. 515, No. 7-8, Feb. 15, 2007 Elsevier-Sequoia S.A. (whole document).

Chongmu Lee, et al., "dependence of the electrical properties of the ZnO thin films grown by atomic layer epitaxy on the reactant feed sequence," J. Vac. Sci. Technol. A 24(4), Jul./Aug. 2006, pp. 1031-1035.

* cited by examiner

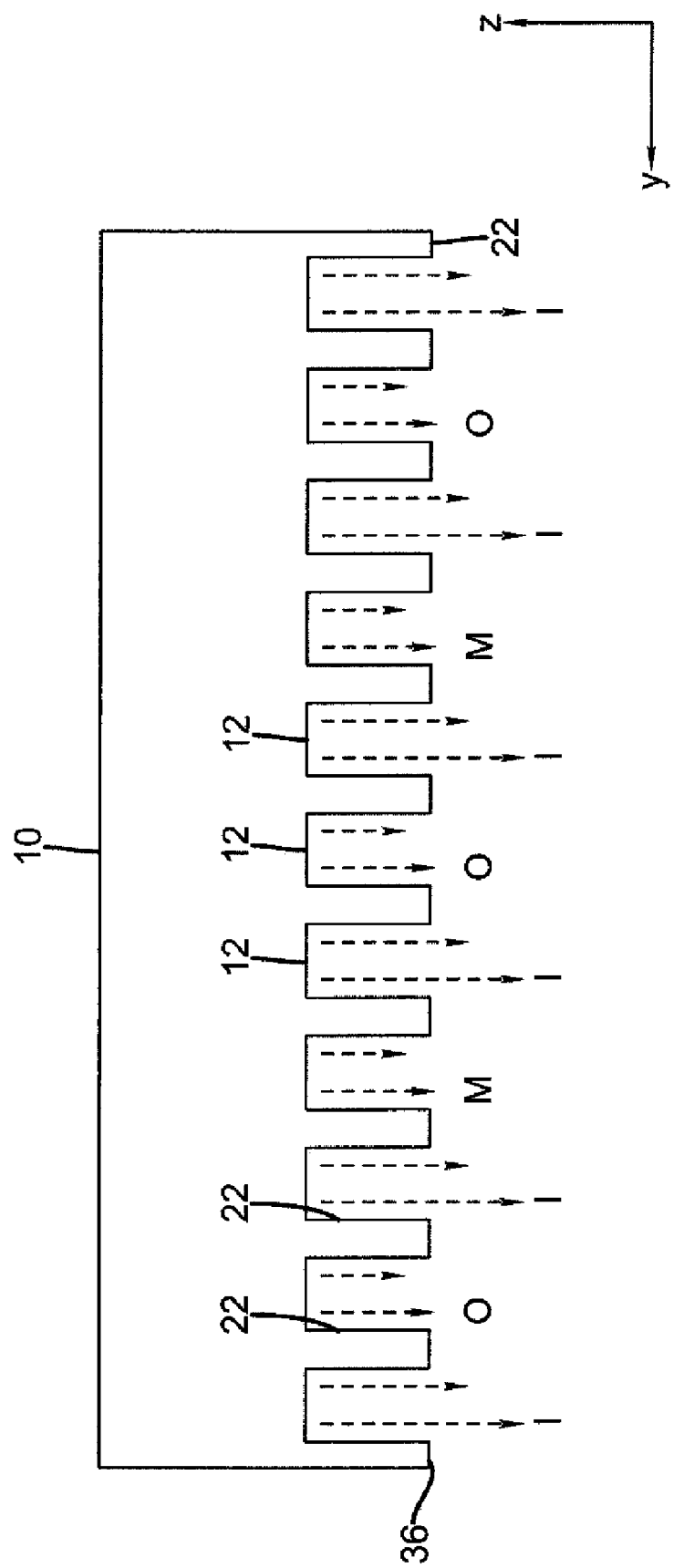

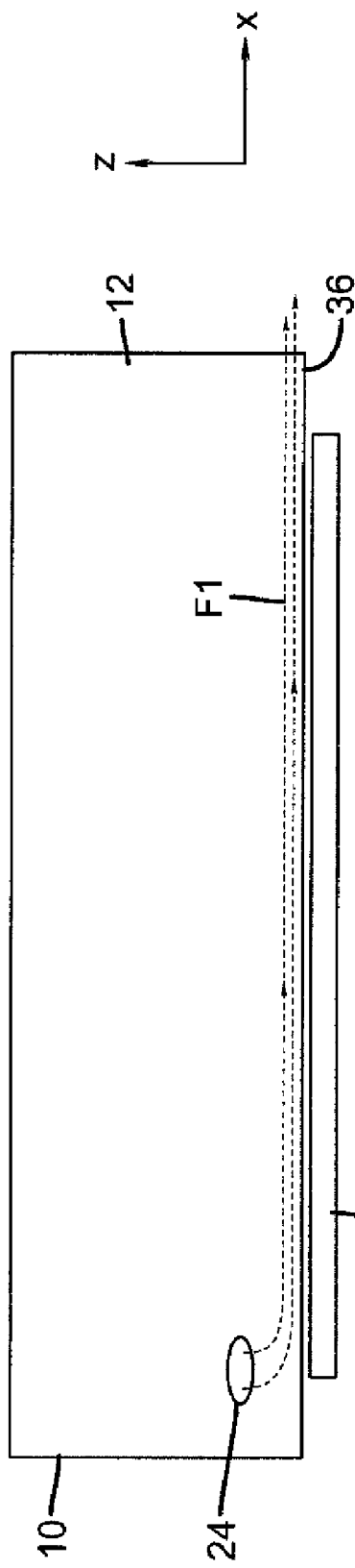
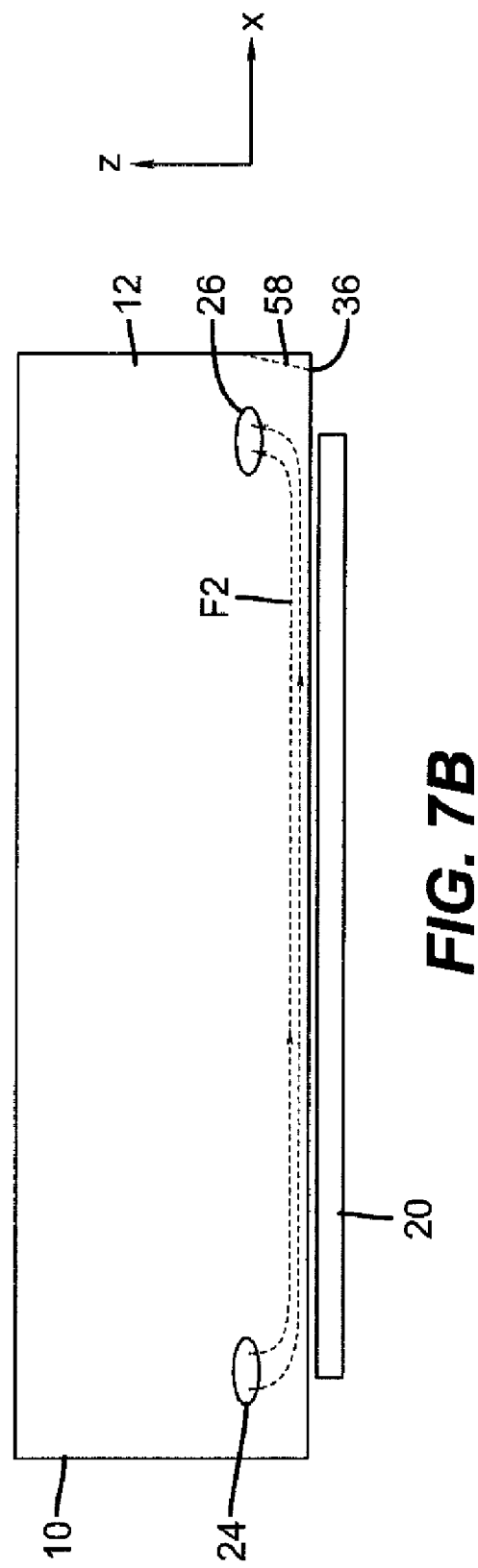

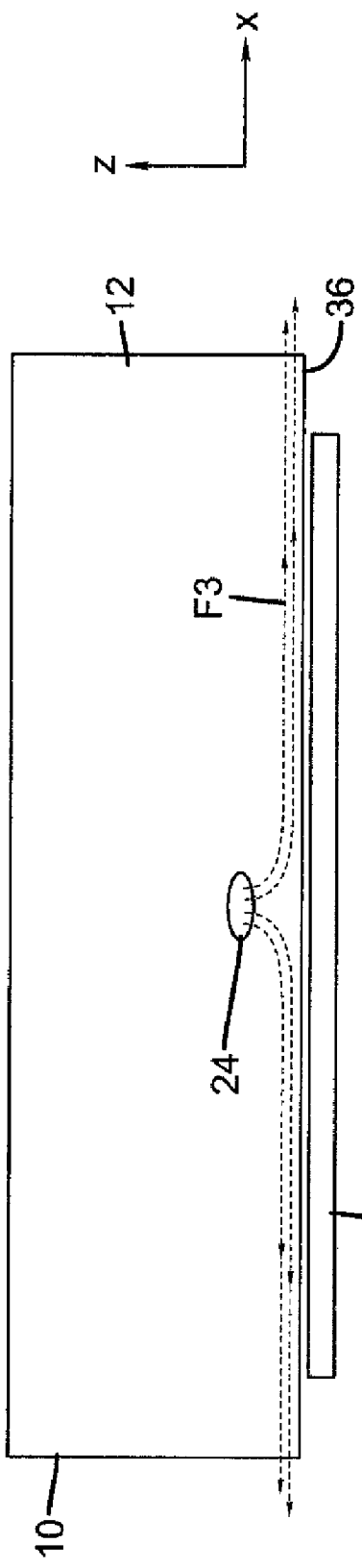
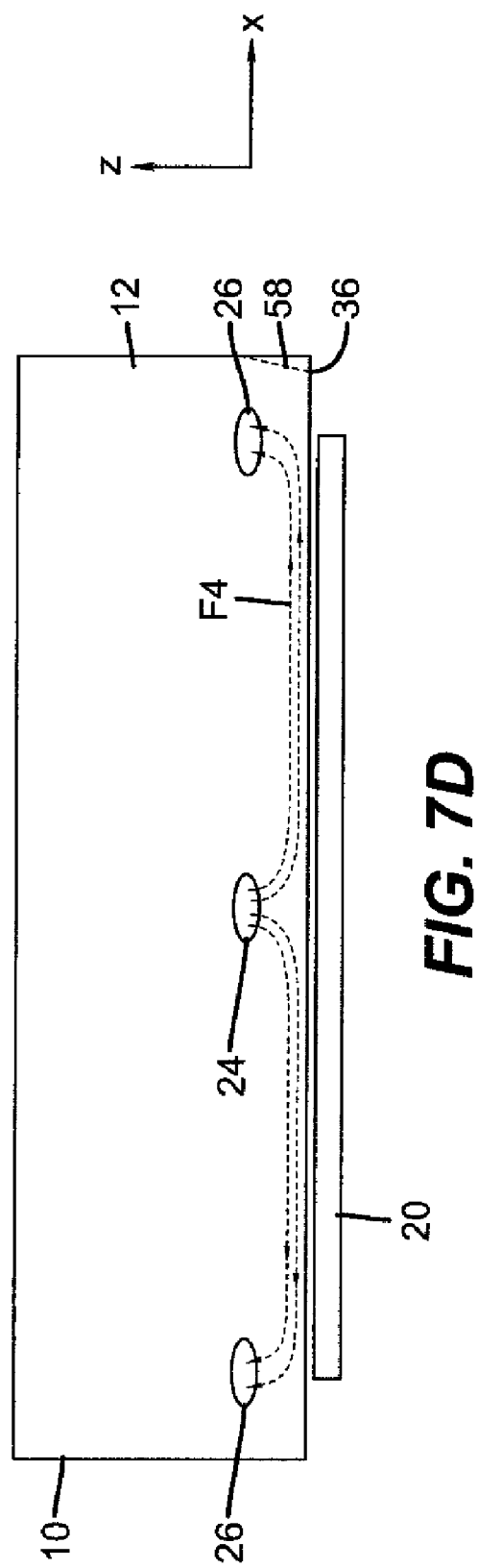

PROCESS FOR ATOMIC LAYER DEPOSITION

CROSS-REFERENCE TO RELATED APPLICATIONS

The present application is related to U.S. Pat. Nos. 7,413,982 and 7,456,429 (Levy), U.S. Application Publication Nos. 2008/0166880 (Levy), 2008/0166884 (Nelson et al.), 2009/0130858 (Levy), 2008/0182358 (Cowdery-Corvan et al.), 2009/0078204 and 2009/0081366 (Kerr et al.) and U.S. Pat. No. 7,572,686 (Levy et al.) all the above identified applications incorporated by reference in their entirety.

FIELD OF THE INVENTION

This invention generally relates to thin film electronic components and devices, such as thin film transistors, environmental barrier layers, capacitors, insulators, and bus lines, where a plurality of the layers are made by an atmospheric atomic layer deposition process. In particular, the present invention relates to a process for making semiconductor material layers, dielectric material layers, conducting electrode material layers and protective layers for thin film transistors, which can be used in electronic devices, particularly in displays.

BACKGROUND OF THE INVENTION

Deposition of materials is a key step in fabrication of thin film electronic devices, including semiconductor devices and supporting electronic components such as resistors and capacitors, insulators, protective layers, bus lines, and other conductive structures. Traditional thin film electronic materials deposition is conducted using expensive vacuum deposition methods including evaporation, CVD, and sputtering. There is substantial interest in utilizing processes for deposition that do not involve the expense associated with vacuum processing. In typical vacuum processing, a large metal chamber and sophisticated vacuum pumping systems are required in order to provide the necessary environment. These items increase the capital cost of systems and preclude the easy use of continuous web based systems.

The cost of deposition equipment for electronic device manufacture, in terms of both the initial expenditure, cycle time, and floor space, continues to be a large incentive driving manufacturing productivity improvements. Traditionally, semiconductor manufacturers seeking to improve process cycle time arrange equipment to minimize travel distance of material between process steps. Unfortunately, this approach often results in tools of different size being placed next to each other at the expense of efficient use of fab space. In contrast, placement of groups of like equipment together results in the highest possible tool packing density; however material flow and cycle time are often compromised.

Adoption of a common tool set for deposition of a variety of electronic materials presents several opportunities for improving the design of a production facility. A common equipment base offers a high tool packing density simply because deposition modules of the same size fit together and minimize the amount of space wasted. Being able to change the material deposited through a particular equipment module allows enormous flexibility in process flow, even enabling multiple products from a single production facility. Many other cost benefits also follow from the need to maintain fewer types of equipment.

There is a also interest in depositing electronic materials on plastic or flexible substrates, particularly because these supports would be more mechanically robust, lighter weight, and potentially lead to cheaper manufacturing by allowing roll-to-roll processing. A useful example of a flexible substrate is polyethylene terephthalate. Such plastics, however, limit device processing to below 200° C.

Thin film transistors (TFTs) are representative of the electronic and manufacturing issues for most thin-film components. Thin film transistors (TFTs) are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. Critical to fabricating the thin film transistor is the deposition of materials, including a semiconductor or channel material, gate dielectric, conducting electrodes, and a protective material, onto the substrate. Presently, most thin film devices are made using vacuum deposited amorphous silicon as the channel material.

Amorphous silicon as a semiconductor for use in TFTs still has its drawbacks. The deposition of amorphous silicon, during the manufacture of transistors, requires relatively difficult or complicated processes such as plasma enhanced chemical vapor deposition and high temperatures (typically about 360° C.) to achieve the electrical characteristics sufficient for display applications. Such high processing temperatures disallow deposition on substrates made of certain plastics that might otherwise be desirable for use in applications such as flexible displays.

In the past decade, various materials have received attention as a potential alternative to amorphous silicon for use in semiconductor channels of thin film transistors. Semiconductor, dielectric, conducting, and protective materials are desirable that are simpler to process, especially those that are capable of being applied to large areas by relatively simple processes. Semiconductor, dielectric, conducting, and protective materials that can be deposited at lower temperatures would open up a wider range of substrate materials, including plastics, for flexible electronic devices.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below.

A semiconductor material useful in a TFT must display several characteristics. In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the native charge carrier concentration. Furthermore, it is desired that the device be weakly or not at all influenced by visible light to avoid a light-protection layer. In order for this to be true, the semiconductor band gap must be sufficiently large (>3 eV) so that exposure to visible light does not cause an inter-band transition. Zinc oxide based materials are capable of delivering these features. Furthermore, in a real high volume web based atmospheric manufacturing scheme, it is highly desirable that the chemistries used in the process be both cheap and of low toxicity, which can be satisfied also by the use of ZnO-based materials and the majority of its precursors.

High on/off ratios result when the device in its off state has very low current flow, often referred to as current leakage. There are many applications in which low leakage is essential. In display applications, low leakage is required for the pixel select transistor. This select transistor is a switch that allows a charge to enter in and be stored in the pixel. In a perfect transistor without leakage, once the charge is stored in the pixel the transistor is switched to its off state and this charge cannot diminish by leakage through the select transistor. Too high of an off current in a transistor will cause a decay in stored charge in the pixel which results in poor display performance.

Another transistor characteristic that is relevant for useful operation is the steepness of the transistor turn on, represented by the subthreshold slope. As the gate voltage of a transistor is varied, the transistor will start in an off state, characterized by low current flow, and transition to an on state, characterized by high current flow. When the gate voltage reaches a point at which the transistor begins to turn on, there is a substantial increase in drain current with increasing gate voltage. This increase, called the subthreshold slope, is measured in volts of gate voltage per decade of drain current. This expression therefore represents the number of volts of gate voltage required to produce a 10-fold increase in drain current. Lower values of the subthreshold slope indicate faster device turn on and are desirable.

Various processes for making zinc oxide films have been disclosed, both high temperature and low temperature processes, including radio frequency magnetron sputtering or modified reactive planar magnetron sputtering.

Ohya et al. (Japanese Journal of Applied Physics, Part 1, January 2001, vol. 40, no. 1, pages 297-8) disclose a thin film transistor of ZnO fabricated by chemical solution deposition.

Transparent conducting oxides are reviewed in the August 2000 issue of the Materials Research Bulletin, Volume 25 (8) 2000, devoted to materials and properties of transparent conducting oxide compounds.

One low temperature process for deposition of such oxide semiconductors is disclosed in US 2004/0127038 to Carcia et al. This patent publication discloses a semiconductor deposition process that uses magnetron sputtering of a metal oxide ($ZnO$, $In_2O_3$, $SnO_2$, CdO) or metal (Zn, In, Sn, Cd) target in an atmosphere with a controlled partial pressure of oxygen in an inert gas. This is a low temperature process that is compatible with temperature sensitive substrates and components, for example, drive circuits for displays on flexible, polymer substrates. The field effect transistors of Carcia et al. are based on a nominally undoped metal oxide semiconductor that must be deposited using physical vapor deposition or chemical vapor deposition, preferably rf (radio frequency) magnetron sputtering.

Japanese Kokai JP2004349583 discloses a method of producing a thin film transistor in which a dispersion of zinc-oxide nanoparticles is ink-jetted to form the semiconducting channel. No actual examples, however, are described relating to the preparation of the dispersion.

US 2004/0127038 discloses a method to produce high quality zinc-oxide thin film transistors using sputtering as a vacuum deposition method.

Steven K. Volkman et al., in "A novel transparent air-stable printable n-type semiconductor technology using ZnO nanoparticles," 2004 IEEE International Electron Device meeting Technical Digest, pp. 769, 2004, disclose a method for producing thin film transistors using organically stabilized zinc-oxide nanoparticles. The disclosed process involves an exposure to a temperature of 400° C.

Although successful zinc oxide based devices have been made with sputtering techniques, it is clear that very precise control over the reactive gas composition (such as oxygen content) is required to produce good quality devices. Chemical vapor deposition (CVD) techniques, in which two reactive gasses are mixed to form the desired film material, can be useful routes to achieving high quality film growth. Atomic layer deposition ("ALD") is yet another alternative film deposition technology that can provide improved thickness resolution and conformal capabilities, compared to its CVD predecessor. The ALD process segments the conventional thin-film deposition process of conventional CVD into single atomic-layer deposition steps.

ALD can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors.

Examples of useful semiconducting materials are compound semiconductors such as gallium arsenide, gallium nitride, cadmium sulfide, zinc oxide, and zinc sulfide.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate-AH} + \text{ML}_x \rightarrow \text{substrate-AML}_{x-1} + \text{HL} \quad (1)$$

where HL is a reaction by-product. During the reaction, the initial surface ligands, AH, are consumed, and the surface becomes covered with $\text{AML}_{x-1}$ ligands, which cannot further react with metal precursor $\text{ML}_x$. Therefore, the reaction self-terminates when all of the initial AH ligands on the surface are replaced with $\text{AML}_{x-1}$ species. The reaction stage is typically followed by an inert-gas purge stage that eliminates the excess metal precursor and the HL by-product species from the chamber prior to the separate introduction of the other precursor.

A second molecular precursor then is used to restore the surface reactivity of the substrate towards the metal precursor. This is done, for example, by removing the L ligands and re-depositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + \text{AH}_Y \rightarrow \text{substrate-A-M-AH} + \text{HL} \quad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:

1. $\text{ML}_x$ reaction;
2. $\text{ML}_x$ purge;
3. $\text{AH}_y$ reaction; and
4. $\text{AH}_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

Self-saturating surface reactions make ALD insensitive to transport non-uniformities, which might otherwise impair surface uniformity, due either to engineering tolerances and the limitations of the flow process or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide a uniform film thickness in a range of from about 3 nm to 300 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

An ALD process must be able to execute this sequencing efficiently and reliably for many cycles in order to allow cost-effective coating of many substrates. In an effort to minimize the time that an ALD reaction needs to reach self-termination, at any given reaction temperature, one approach has been to maximize the flux of chemicals flowing into the ALD reactor, using a so-called "pulsing" process. In the pulsed ALD process, a substrate sits in a chamber and is exposed to the above sequence of gases by allowing a first gas to enter the chamber, followed by a pumping cycle to remove that gas, followed by the introduction of a second gas to the chamber, followed by a pumping cycle to remove the second gas. This sequence can be repeated at any frequency and variations in gas type and/or concentration. The net effect is that the entire chamber experiences a variation in gas composition with time, and thus this type of ALD can be referred to as time dependent ALD. The vast majority of existing ALD processes are time dependent ALD.

In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized.

Existing ALD approaches have been compromised with the trade-off between the need to shorten reaction times and improve chemical utilization efficiency, and on the other hand, the need to minimize purge-gas residence and chemical removal times. One approach to overcome the inherent limitations of time depended ALD systems is to provide each reactant gas continuously and to move the substrate through each gas in succession. In these systems a relatively constant gas composition exists, but is located to specific areas or spaces of the processing system. Therefore, these systems will be referred to as spatially dependent ALD systems.

For example, U.S. Pat. No. 6,821,563 entitled "GAS DISTRIBUTION SYSTEM FOR CYCLICAL LAYER DEPOSITION" to Yudovsky describes a spatially dependent ALD processing system, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow spatially dependent ALD is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings; diffusion barriers are formed by a carrier gas opening between exhaust openings. Suntola et al. state that operation with such an embodiment is possible even at atmospheric pressure, although little or no details of the process, or examples, are provided.

While processes such as those described in the '563 Yudovsky and '022 Suntola et al. patents may avoid some of the difficulties inherent to pulsed gas approaches, these processes have other drawbacks. For example, it would be very difficult to maintain a uniform vacuum at different points in an array and to maintain synchronous gas flow and vacuum at complementary pressures, thus compromising the uniformity of gas flux that is provided to the substrate surface. Neither the gas flow delivery unit of the '563 Yudovsky patent nor the gas flow array of the '022 Suntola et al. patent can be used in closer proximity to the substrate than about 0.5 mm.

U.S. Patent Publication No. 2005/0084610 to Selitser discloses an atmospheric pressure atomic layer chemical vapor deposition process. Selitser state that extraordinary increases in reaction rates are obtained by changing the operating pressure to atmospheric pressure, which will involve orders of magnitude increase in the concentration of reactants, with consequent enhancement of surface reactant rates. The embodiments of Selitser involve separate chambers for each stage of the process, although FIG. 10 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes thereunder in the process. Little or no specific details of the gas injectors or manifolds are described by Selitser, although it is stated that spacing of the injectors is selected so that cross-contamination from adjacent injectors is prevented by purging gas flows and exhaust manifolds incorporated in each injector.

A spatially dependent ALD process can be accomplished with other apparatus or systems described in more detail in U.S. Pat. Nos. 7,413,982 and 7,456.429 (Levy), U.S. Application Publication Nos. 2008/0166884, 2009/0130858. All these identified applications hereby incorporated by reference in their entirety. These systems attempt to overcome one of the difficult aspects of a spatial ALD system, which is undesired intermixing of the continuously flowing mutually reactive gases. In particular, U.S. Pat. No. 7,413,982 employs a novel transverse flow pattern to prevent intermixing, while U.S. Application Publication Nos. 2009/0130858 and 2008/0166884 employ a coating head partially levitated by the pressure of the reactive gases of the process to accomplish improved gas separation.

The references discussed above are mostly concerned with making a single layer by using various ALD methods. There is no recognition of the potential manufacturing benefits to having a single piece of deposition equipment to deposit most, if not all, of the active layers in a TFT device.

Sugihara et al., US 2006/0244107, disclose a method to prepare acceptor-doped ZnO-based TFTs with an adjacent barrier layer. In their method, the films are prepared by using pulsed laser deposition with a substrate temperature of 300° C. and using nitric oxide as the N-dopant for the ZnO-based semiconductor layer. Sugihara et al. do discuss TFTs where the dielectric ($Al2O3$), the semiconductor (ZnO) and the protective layer ($Al2O3$) are all deposited using the same method. However, the method disclosed in Sugihara et al. of pulsed laser deposition is a vacuum process and not well suited for high throughput. Additionally, there is no recognition in Sugihara et al. that having a common process is a manufacturing advantage; in fact they propose alternative materials for the protective layer, including resins, which could not be deposited by the pulsed laser deposition method used to deposit the semiconductor.

Thus, a need still remains to be able to make high quality TFT devices at low cost, without the need for multiple types of deposition equipment

SUMMARY OF THE INVENTION

The present invention relates to a process of making a thin film transistor comprising at least five layers including a gate layer, a dielectric layer, a channel layer, a source-drain layer, and a protective layer, wherein at least three layers are grown a by an atomic layer deposition (ALD) process that is carried out substantially at or above atmospheric pressure, wherein the temperature of the substrate during deposition is under 300° C., and wherein the ALD process comprises simultaneously directing a series of gas flows comprising, in order, at least a first reactive gaseous material, an inert purge gas, and a second reactive gaseous material through a plurality of output openings spaced apart from the substrate, and transporting the substrate in a direction relative to the plurality of output openings, such that the substrate experiences a sequence of the first, second and third gaseous materials and whereby the sequence causes a layer to be formed on the substrate by ALD.

The present invention further relates to a process of making semiconductor material layers, dielectric material layers, conducting electrode material layers, and protective layers for thin film transistors, which are deposited employing a common piece of equipment, wherein the process is carried out substantially at or above atmospheric pressure and the temperature of the substrate during deposition is under 300° C. During the process, the substrate or deposition device for the gaseous materials, or both, is capable of providing relative movement between the output face of the deposition device and the substrate while maintaining close proximity.

In a preferred embodiment, the process can be operated with continuous movement of a substrate being subjected to thin film deposition, wherein the process is capable of conveying the support on or as a web past the deposition device, preferably in an unsealed environment open to ambient at substantially atmospheric pressure.

It is an advantage of the present invention that it provides an advantageous process for atomic layer deposition of a zinc-oxide-based n-type semiconductor onto a substrate, well suited to a number of different types of substrates and deposition environments.

It is yet a further advantage of the present invention that it is adaptable for deposition on a web or other moving substrate, including deposition onto a large area substrate.

It is a further advantage of the present invention that it allows operation, in preferred embodiments, under atmospheric pressure conditions.

It is still a further advantage of the present invention that it can be employed in low temperature processes at atmospheric pressures, which process may be practiced in an unsealed environment, open to ambient atmosphere.

The invention is also directed to a transistor comprising a zinc-oxide-based semiconductor, preferably on a flexible substrate, made by the present process.

Semiconductor films made by the present method are capable of exhibiting, in the film form, excellent field-effect electron mobilities of greater than 0.1 $cm^2/Vs$ and on-off ratios of greater than $10^4$, in which performance properties are sufficient for use in a variety of relevant technologies, including active matrix display backplanes.

A TFT structure includes, in addition to the semiconductor, conducting electrodes, commonly referred to as a source and a drain, for injecting a current into the semiconductor. The semiconductor films made by the present invention can be used in thin film transistors each comprising spaced apart first and second contact means connected to a semiconductor film. A third contact means can be spaced from said semiconductor film by an insulator, and adapted for controlling, by means of a voltage applied to the third contact means, a current between the first and second contact means through said film. The first, second, and third contact means can correspond to a drain, source, and gate electrode in a field effect transistor.

The objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 3 is a cross-sectional side view of an embodiment, for one exemplary system of gaseous materials, of the distribution of gaseous materials to a substrate that is subject to thin film deposition;

FIGS. 7A, 7B, 7C, and 7D are cross-sectional views taken orthogonally to the cross-sectional views of previous FIGS. 2-4B, showing gas flow directions for output channels in various embodiments;

DETAILED DESCRIPTION OF THE INVENTION

Figure 1:
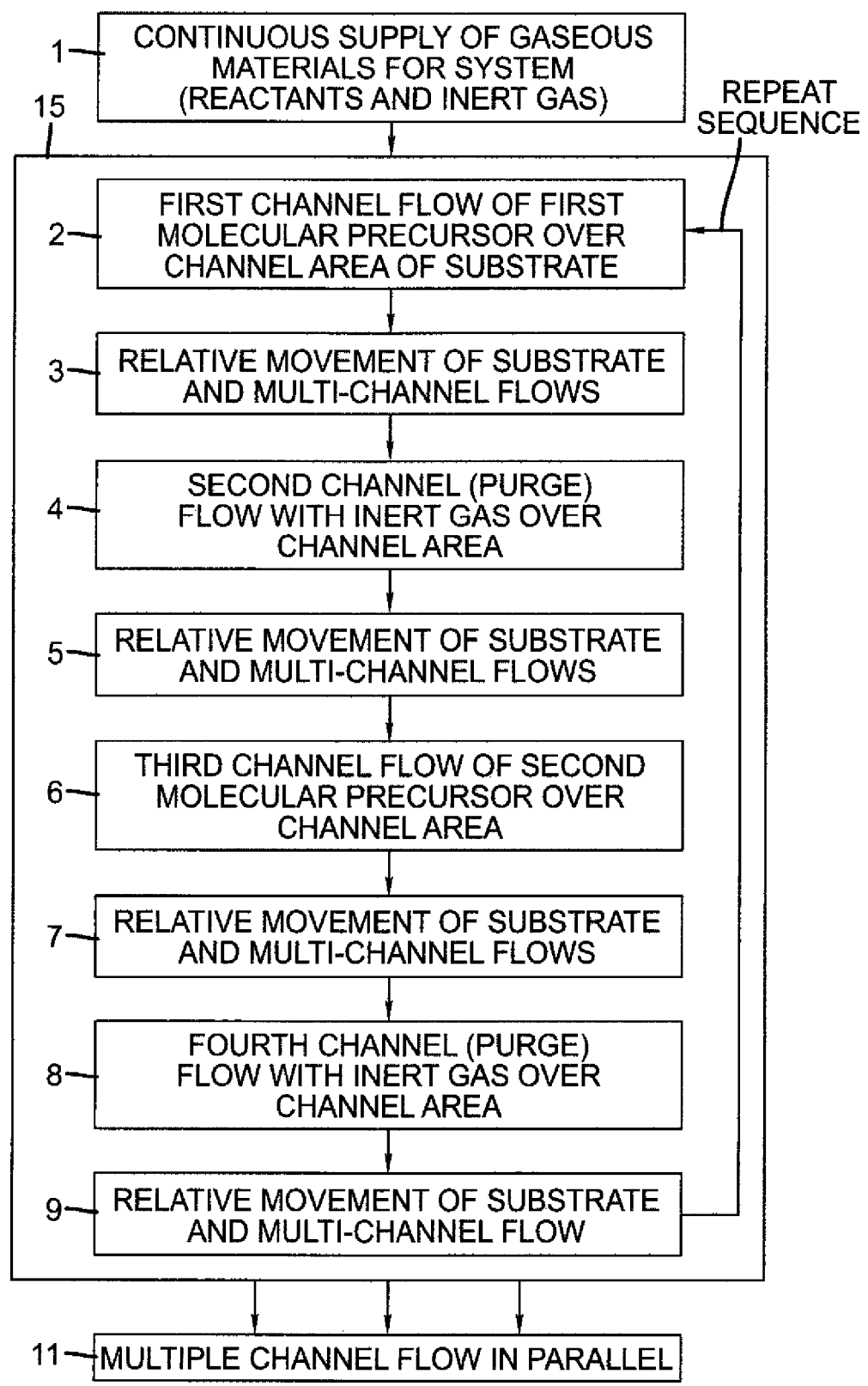
FIG. 1 is a flow chart describing the steps of the present process.

The entire process of making the thin film transistor or electronic device of the present invention, or at least the production of the thin film semiconductor, can be carried out below a maximum support temperature of about 300° C., more preferably below 250° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive circuits containing thin film transistors with significantly improved performance.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The process of the present invention offers a significant departure from conventional approaches to making a thin film transistor, employing a system for delivery of gaseous materials to a substrate surface to deposit the functional layers, and that can be adaptable to deposition on larger and web-based substrates and capable of achieving a highly uniform thin-film deposition at improved throughput speeds. The process of the present invention employs a continuous spatially dependent ALD (as opposed to pulsed or time dependent ALD) gaseous material distribution for three or more of the transistor components. The process of the present invention allows operation at atmospheric or near-atmospheric pressures and is capable of operating in an unsealed or open-air environment.

In one embodiment of the present process, the gate layer, dielectric layer for the gate layer, channel layer, source drain layer, and protective layer in thin film transistors are grown by an atomic layer deposition process. In another embodiment, only (or at least) the dielectric layer, channel layer, and the protective layer are grown by the present atomic layer deposition process. In yet another embodiment, only (or at least) the gate layer, the dielectric layer, channel layer, and the protective layer are grown by the present atomic layer deposition process. In one particular embodiment, at least three of the five layers are oxide layers. In another particular embodiment, the gate layer is grown by the present atomic layer deposition process and the gate layer is zinc oxide doped with an element selected from indium, aluminum, boron, and fluorine. In yet another particular embodiment, the source-drain layer is grown by the present atomic layer deposition process and the source-drain layer is zinc oxide doped with an element selected from indium, aluminum, boron, and fluorine. In yet another embodiment of the present process, the gate layer is a metal grown by the present atomic layer deposition process, the gate layer, and the source-drain layer is a metal grown by the present said atomic layer deposition process.

FIG. 1 is a generalized step diagram of one embodiment of a process for making a film for use in an active layer of a TFT for one embodiment of the present invention, in which two reactive gases are used, a first molecular precursor and a second molecular precursor. Gases are supplied from a gas source and can be delivered to the substrate, for example, via a deposition device. Metering and valving apparatus for providing gaseous materials to the deposition device can be used.

As shown in Step 1, a continuous supply of gaseous materials for the system is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now (in this particular embodiment, transversely and substantially parallel to the surface of the substrate) over the given channel area of the substrate and reacts with the previous layer on the substrate to produce (theoretically) a monolayer of a desired material. A first molecular precursor is in gas form, for example, an organometallic compound such as diethylzinc or trimethyl-aluminum. In such an embodiment, the second molecular precursor is also in gaseous form and can be, for example, a non-metallic oxidizing compound. Optionally, a volatile acceptor doping compound can be supplied to the system in any way in which allows it to react to sites in the growing film. Thus, it can be delivered with the first or second molecular precursors, or with the purge gas. Preferably the volatile acceptor is delivered in common with the oxidizing molecular precursor.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film. In the present embodiment of the process, the steps are repeated with respect to a given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed, which results in multiple channel flows in parallel, as indicated in overall Step 11. Parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with metal at the surface, for example, in the ZnO example, forming an oxide with a freshly deposited zinc-containing precursor.

This particular embodiment does not need to use a vacuum purge to remove a molecular precursor after applying it to the substrate. Purge steps are expected by most researchers to be the most significant throughput-limiting step in ALD processes.

Assuming that, for the two reactant gases in FIG. 1, AX and BY are used, for example. When the reaction gas AX flow is supplied and flowed over a given substrate area, atoms of the reaction gas AX are chemically adsorbed on a substrate, resulting in a layer of A and a surface of ligand X (associative chemisorptions) (Step 2). Then, the remaining reaction gas AX is purged with an inert gas (Step 4). Then, the flow of reaction gas BY, and a chemical reaction between AX (surface) and BY (gas) occurs, resulting in a molecular layer of AB on the substrate (dissociative chemisorptions) (Step 6). The remaining gas BY and by-products of the reaction are purged (Step 8). The thickness of the thin film can be increased by repeating the process cycle (steps 2-9) many times.

Because the film can be deposited one monolayer at a time it tends to be conformal and have uniform thickness.

Oxides that can be made using the process of the present invention include, but are not limited to: ZnO, $Al_2O_3$, titanium oxides, indium oxide, and tin oxide. Mixed structure oxides that can be made using the process of the present invention can include, for example, InZnO. Doped materials that can be made using the process of the present invention can include, for example, ZnO:Al, $Mg_xZn_{1-x}O$, and LiZnO.

Metals that can be made using the process of the present invention include, but are not limited to: copper, tungsten, aluminum, nickel, ruthenium, and rhodium. It will be apparent to the skilled artisan that alloys of two, three or more metals may be deposited, compounds may be deposited with two, three, or more constituents, and such things as graded films and nano-laminates may be produced as well.

These variations are simply variants using particular embodiments of the invention in alternating cycles. There are many other variations within the spirit and scope of the invention, so the invention is limited only by the claims that follow.

For various volatile zinc-containing precursors, precursor combinations, and reactants useful in ALD thin film processes, reference is made to the Handbook of *Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

Figure 2:
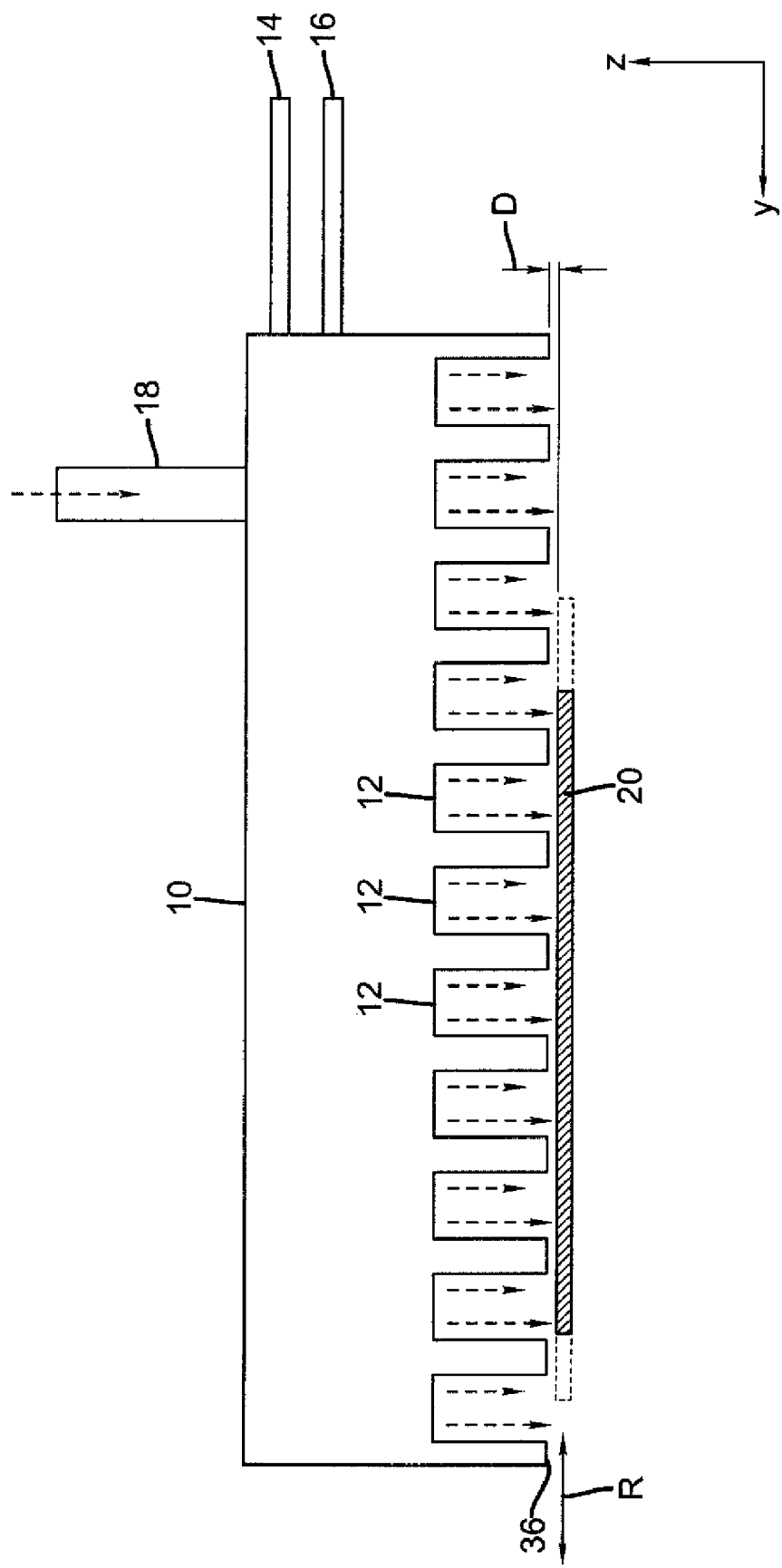
FIG. 2 is a cross-sectional side view of one embodiment of a deposition device for atomic layer deposition that can be used in the present process.

Referring now to FIG. 2, there is shown a cross-sectional side view of one embodiment of a deposition device 10 that can be used in the present process for atomic layer deposition of a semiconductor onto a substrate 20 according to the present invention. Deposition device 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 2 and subsequent FIGS. 3-4B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Deposition device 10 is spaced a distance D from substrate 20, provided on a substrate support, as described in more detail subsequently. Reciprocating motion can be provided between substrate 20 and deposition device 10, either by movement of substrate 20, by movement of deposition device 10, or by movement of both substrate 20 and deposition device 10. In the particular embodiment shown in FIG. 2, substrate 20 is moved across output face 36 in reciprocating fashion, as indicated by the arrow R and by phantom outlines to the right and left of substrate 20 in FIG. 2. It should be noted that reciprocating motion is not always required for thin-film deposition using deposition device 10. Other types of relative motion between substrate 20 and deposition device 10 could also be provided, such as movement of either substrate 20 or deposition device 10 in one or more directions, as described in more detail subsequently.

The cross-sectional view of FIG. 3 shows gas flows emitted over a portion of output face 36 of deposition device 10. In this particular arrangement, each output channel 12, separated by partitions 22, is in gaseous flow communication with one of gas inlet ports 14, 16 or 18 seen in FIG. 2. Each output channel 12 delivers typically a first reactant gaseous material O, or a second reactant gaseous material M, or a third inert gaseous material I.

FIG. 3 shows a relatively basic or simple arrangement of gases. It is envisioned that a plurality of non-metal deposition precursors (like material O) or a plurality of metal-containing precursor materials, including at least a zinc-containing precursor (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The inter-stream labeled I separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 3 and following suggests some typical types of reactant gases. For example, first reactant gaseous material O could be an oxidizing gaseous material; second reactant gaseous material M could be a metallic zinc-containing compound. Inert gaseous material I could be nitrogen, argon, helium, or other gases commonly used as purge gases in ALD processes. Inert gaseous material I is inert with respect to first or second reactant gaseous materials O and M. Reaction between first and second reactant gaseous materials could form a metal oxide or other binary compound, such as zinc oxide ZnO, in one embodiment. Reactions between more than two reactant gaseous materials could form other zinc-oxide based materials such as a ternary compound, for example, ZnAlO.

Figure 4A:
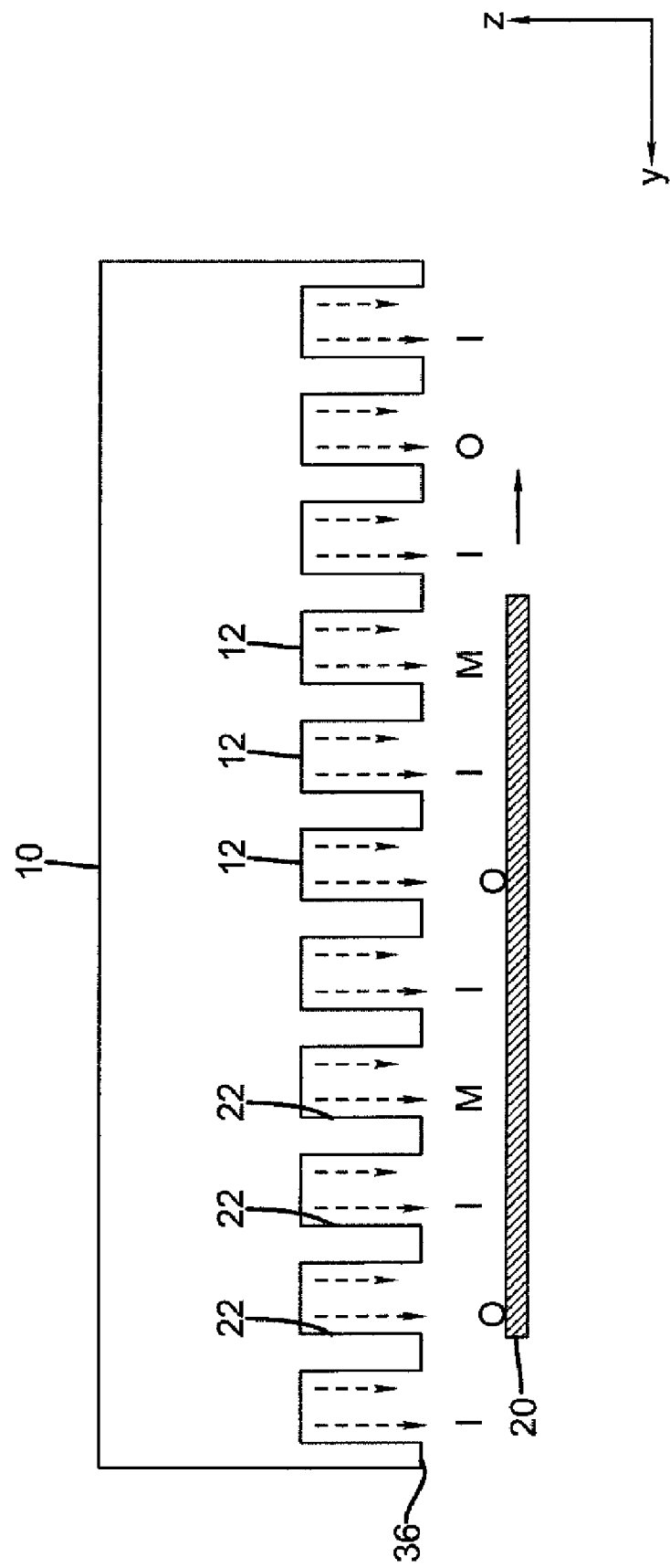
FIGS. 4A and 4B are cross-sectional side views of one embodiment of the distribution of a system of gaseous materials, schematically showing the accompanying deposition operation.
Figure 4B:
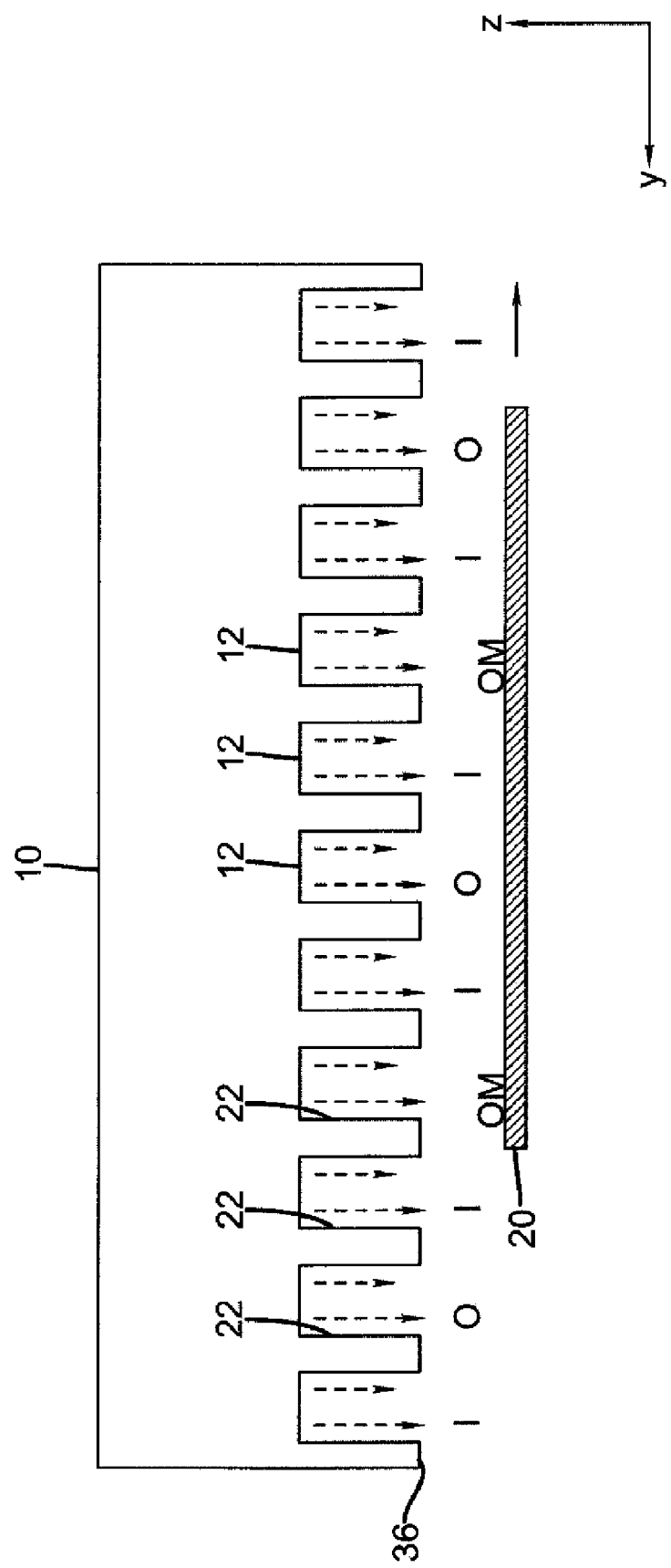

The cross-sectional views of FIGS. 4A and 4B show, in simplified schematic form, the ALD coating operation performed as substrate 20 passes along output face 36 of deposition device 10 when delivering reactant gaseous materials O and M. In FIG. 4A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 4A and 4B show, inert gaseous material I is provided in every alternate output channel 12, between the flows of first and second reactant gaseous materials O and M. Sequential output channels 12 are adjacent, that is, share a common boundary, formed by partitions 22 in the embodiments shown. Here, output channels 12 are defined and separated from each other by partitions 22 that extend at a perpendicular to the surface of substrate 20.

As mentioned above, in this particular embodiment, there are no vacuum channels interspersed between the output channels 12, that is, no vacuum channels on either side of a channel delivering gaseous materials to drawn the gaseous materials around the partitions. This advantageous, compact arrangement is possible because of the innovative gas flow that is used. Unlike gas delivery arrays of earlier processes that apply substantially vertical (that is, perpendicular) gas flows against the substrate and must then draw off spent gases in the opposite vertical direction, deposition device 10 directs a gas flow (preferably substantially laminar in one embodiment) along the surface for each reactant and inert gas and handles spent gases and reaction by-products in a different manner, as described subsequently. The gas flow used in the present invention is directed along and generally parallel to the plane of the substrate surface. In other words, the flow of gases is substantially transverse to the plane of a substrate rather than perpendicular to the substrate being treated.

Figure 5:
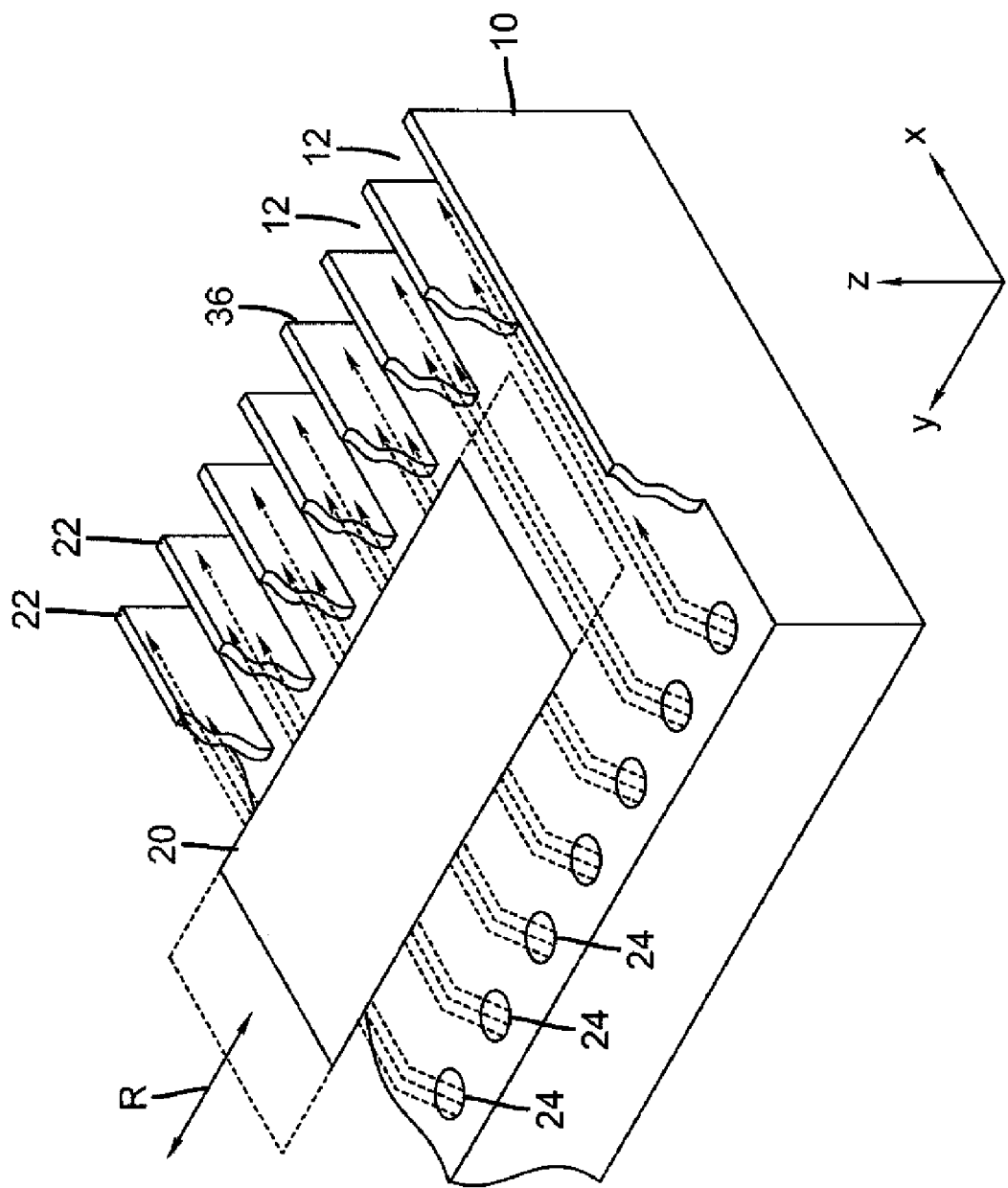
FIG. 5 is a perspective view, from the output face side, of a portion of one embodiment of a deposition device, showing the orientation of output channels relative to the substrate and reciprocating motion, that can be used for deposition on the substrate.
Figure 6:
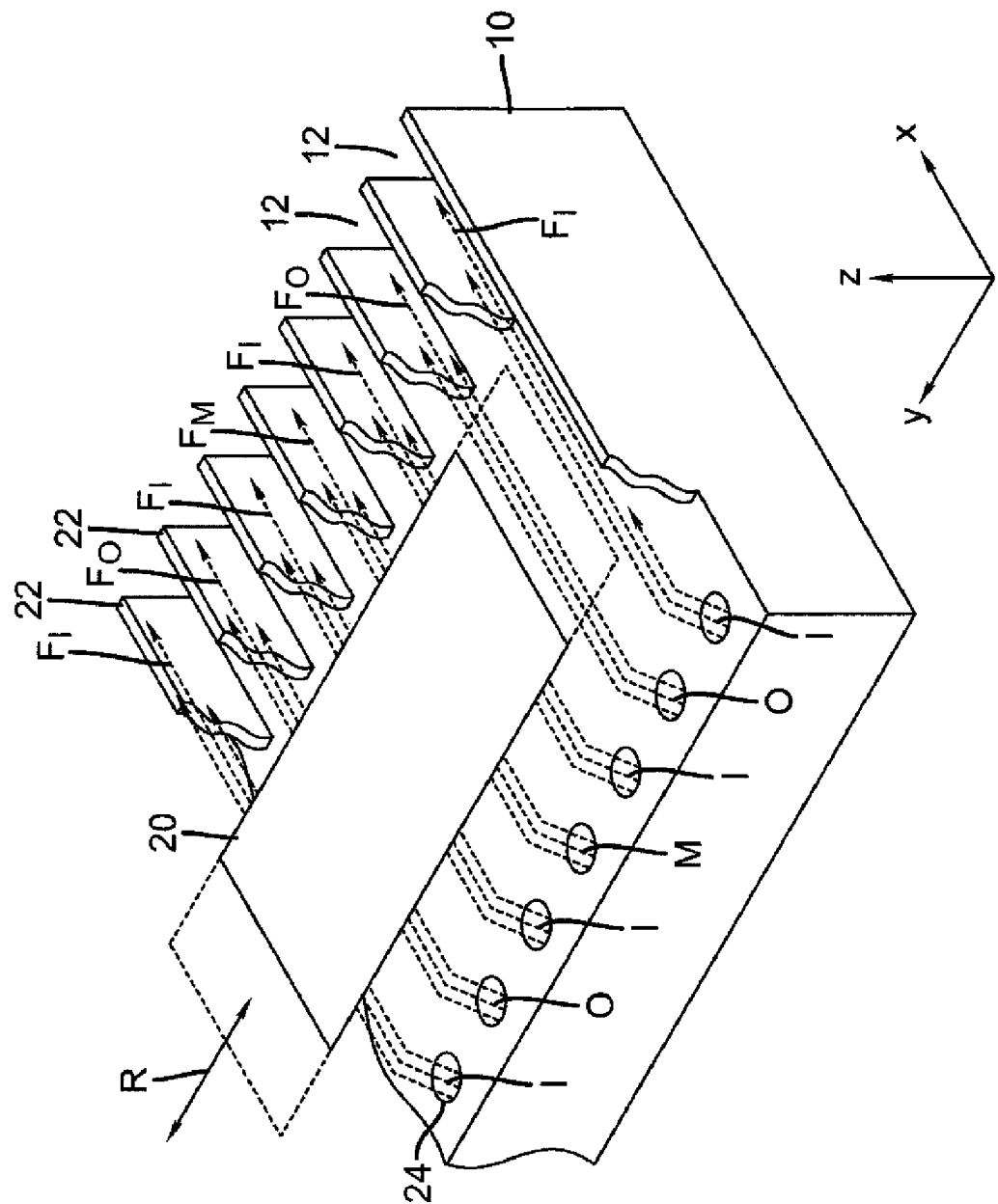
FIG. 6 is a perspective view as in FIG. 5, showing one exemplary arrangement of gas flow in the deposition device.

FIGS. 5 and 6 show perspective views of one embodiment of a deposition device 10 that can be used in the present process, from the output face 36 (that is, from the underside with respect to FIGS. 2-4B). Partitions 22 that define and separate the adjacent output channels 12 in this embodiment are represented as partially cut away, to allow better visibility for the gas flows flowing from gas outlet ports 24. FIGS. 5 and 6 also show reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in they coordinate direction, using this coordinate assignment.

FIG. 6 shows the gas flows $F_I$, $F_O$, and $F_M$ for the various gaseous materials delivered from deposition device 10 with this embodiment. Gas flows $F_I$, $F_O$, and $F_M$ are in the x-direction, that is, along the length of elongated output channels 12.

Figure 15:
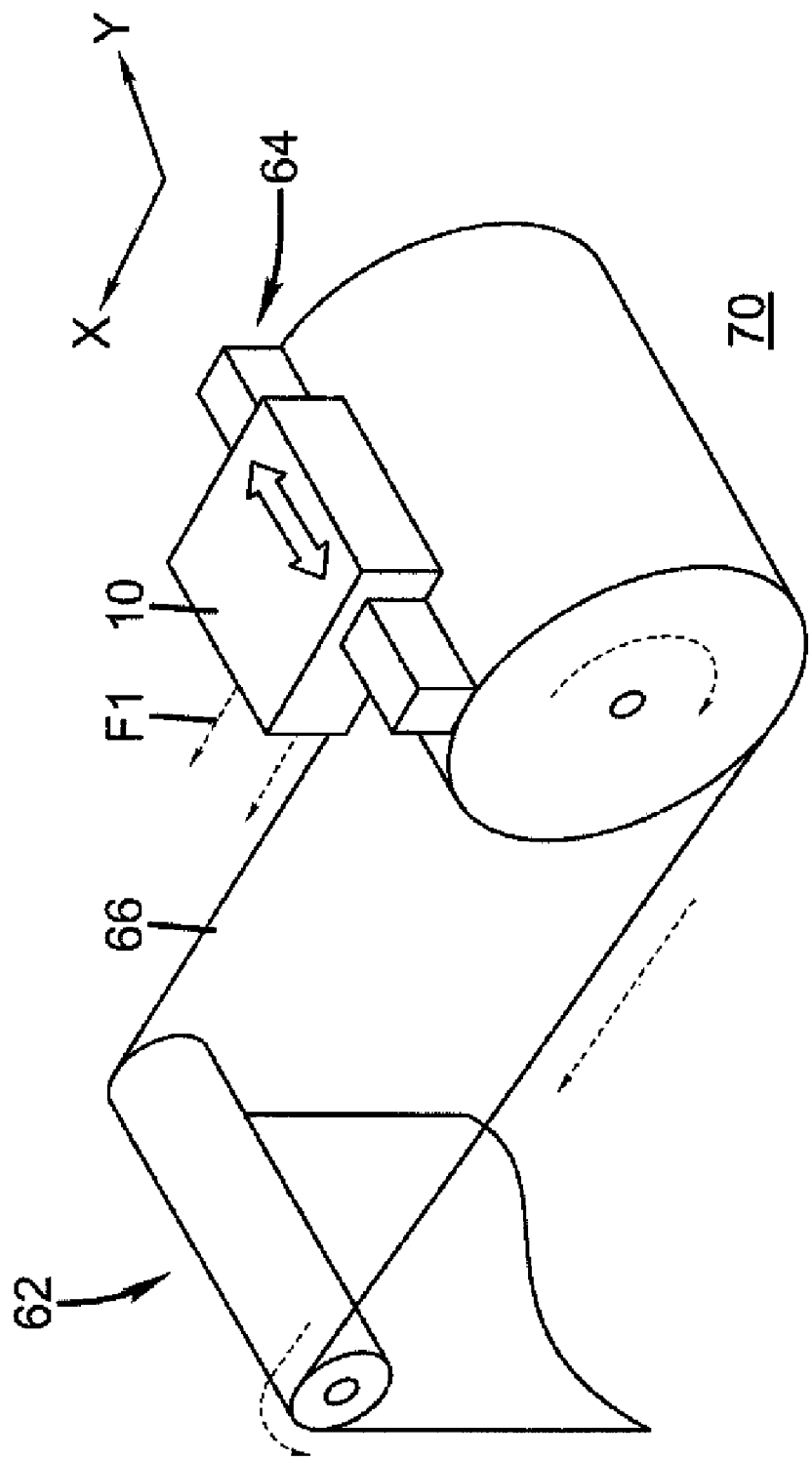
FIG. 15 is a block diagram showing one embodiment of a deposition system applied to a moving web in accordance with the present process.

The cross-sectional views of FIGS. 7A, 7B, 7C, and 7D are taken orthogonally to the cross-sections of FIGS. 2-4B and show gas flows in one direction from this view. Within each output channel 12, the corresponding gaseous material flows from a gas output port 24, shown in phantom in the views of FIGS. 7A, 7B, 7C, and 7D. In the embodiment of FIG. 7A, gas flow F1 directs the gaseous material along the length of output channel 12 and across substrate 20, as was described with reference to FIGS. 5 and 6. Flow F1 continues past the edge of deposition device 10 in this arrangement, flowing outward into the environment or, if desirable, to a gas collection manifold (not shown). FIG. 7B shows an alternative embodiment for gas flow F2 in which output channel 12 also provides an exhaust port 26 for redirection or drawing off of the gas flow. FIG. 7C shows an alternative embodiment for gas flow F3, in which gas output port 24 is centrally located within output channel 12 and directs gaseous material in gas flows along the channel in both directions. FIG. 7D 15 shows an alternate embodiment for gas flow F4, in which gas output port 24 is also centrally positioned, with multiple exhaust ports 26 suitably placed near the extreme ends of output channel 12. Although unidirectional flows are preferred, some degree of mixing can occur and even may be beneficial to some extent, depending on the flow rates and other circumstances involved in a particular application.

A particular deposition device 10 may use output channels 12 configured using any one of the gas flow configurations or combinations thereof, either the F1 flow of FIG. 7A, the F2 flow of FIG. 7B, the F3 flow of FIG. 7C, the F4 flow of FIG. 7D, or some other variation in which gaseous material is directed to flow across substrate 20 along output channel 12, preferably in a substantially laminar or smooth fashion with controlled mixing. In one embodiment, one or more exhaust ports 26 are provided for each output channel 12 that delivers a reactant gaseous material. For example, referring to FIG. 6, output channels 12 for first and second reactant gaseous materials, labeled O and M, are configured with exhaust ports 26 to vent or draw off the reactant substances, following the pattern of flow F2 (FIG. 7B). This allows some recycling of materials and prevents undesirable mixing and reaction near the end of the manifold. Output channels 12 for inert gaseous material, labeled I, do not use exhaust ports 26 and thus follow the pattern of flow F1 (FIG. 7A). Although laminar flows are preferred in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere, whereas a typical vacuum is, for example, below 0.1 atmosphere. An optional baffle 58, as shown in dotted outline in FIGS. 7B and 7D may be provided to redirect the flow pattern into exhaust port 26.

Because no gas flow around partition 22 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 to Yudovsky, cited earlier, required gas flow around the edges of channel sidewalls and was thus limited to 0.5 mm or greater distance to the substrate surface. Positioning the deposition device 10 closer to the substrate surface is preferred in the present invention. In a preferred embodiment, distance D from the surface of the substrate can be 0.4 mm or less, preferably within 0.3 mm, more preferably within 0.25 mm of the output face of the deposition device or the bottom of the guide walls that provide the flow channels.

Figure 8A:
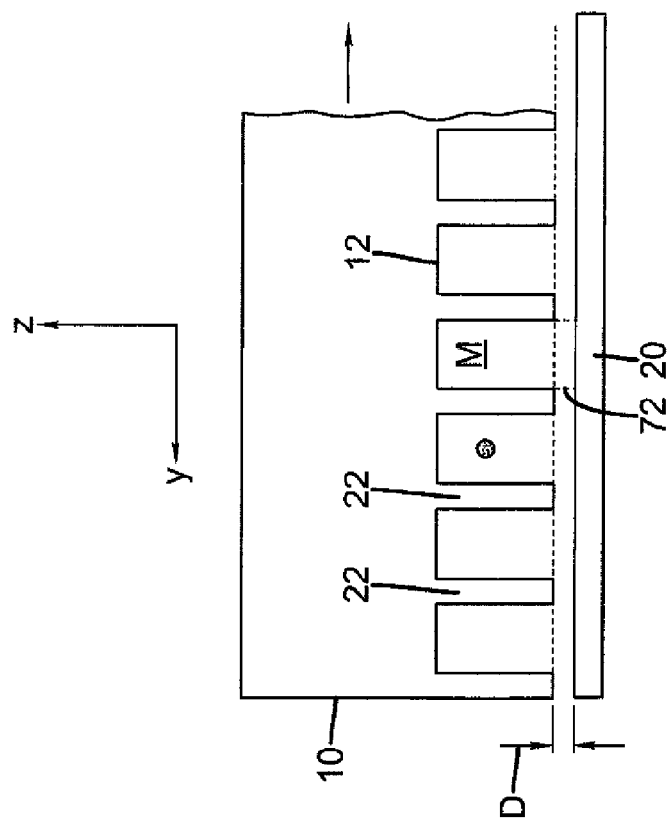
FIGS. 8A and 8B are cross-section views showing the impact of reduced distance from the output face of a deposition device for providing gaseous materials to the substrate surface.
Figure 8B:
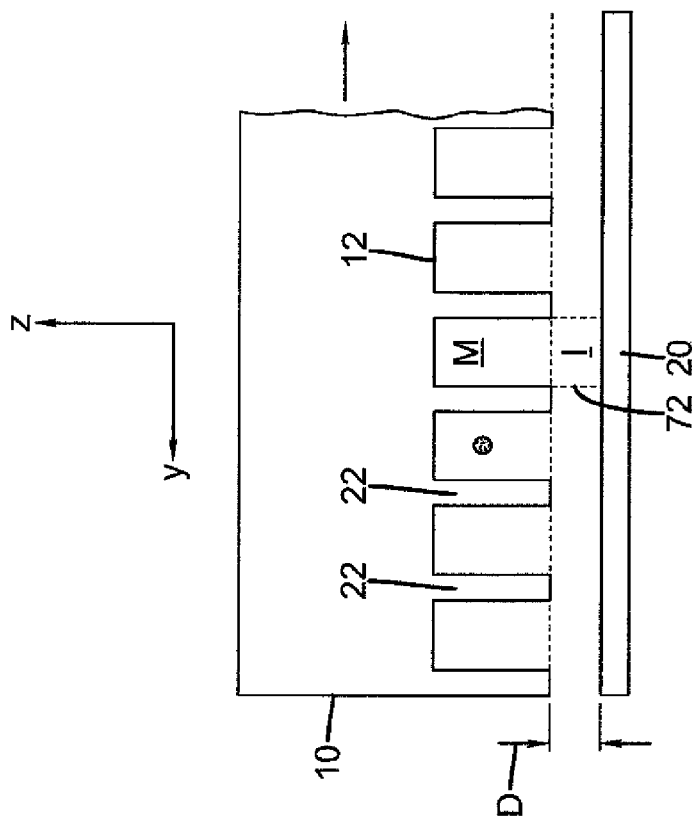

The cross-sectional views of FIGS. 8A and 8B show why it is desirable to have the distance D relatively small, consistent with the operation of the invention. In these figures, deposition device 10 is moving over substrate 20 from left to right, as the arrow indicates. As output channel 12 carrying a reactive gaseous material M moves to the right over an area, it encounters a diffusion layer 72 from the next adjacent (previous-in-time) output channel that is primarily inert gaseous material I. In order to react on the surface of substrate 20, reactive gaseous material M must diffuse through diffusion layer 72, which has a thickness proportional to distance D. By comparison, FIG. 8B shows what happens when distance D is reduced: diffusion layer 72 is reduced proportionately. Diffusion through diffusion layer 72 happens more quickly and more efficiently, allowing less waste and reducing the overall amount of time needed for reaction on the surface of substrate 20. The lower partition walls 22 also prevent less gas to remain from the previous-in time output channel gas. It should be noted that the flow of the gases in the channels are perpendicular to the page of the FIGS. 8A and 8B, as shown by the back of the arrow, which flow maintains a concentration gradient that aids the diffusion through the thin diffusion layer 72 to the surface of the substrate 20. The surface is exposed to the gas flow of M for sufficient time for diffusion and any mixing to replace the previous-in-time output channel gas. In this particular embodiment, the flow of gas is across the surface rather than directly into the surface so that it limits the undesirable mixing of reactant gases between outlet channels, which might otherwise be exacerbated by relative oscillation of the manifold and/or substrate.

In order to provide smooth flow along the length of output channel 12, gas output port 24 may be inclined at an angle away from normal, as indicated in FIGS. 7A and 7B. Optionally, some type of gas flow redirecting structure may also be employed to redirect a downward flow from gas output port 24 so that it forms a gas flow that runs substantially in parallel to output face 36.

Figure 9:
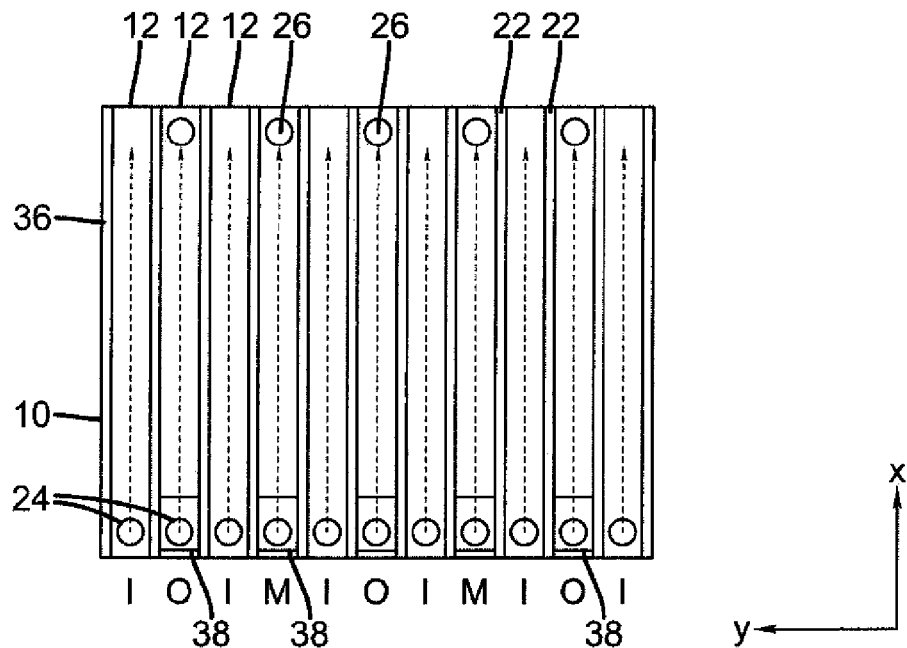
FIG. 9 is a plan view of the output face of a deposition device such as shown in FIG. 3 that can be used in the present process, showing movement of gaseous materials through an arrangement of output channels according to one embodiment of the invention.

The plan view of FIG. 9 shows output face 36 of a portion of a deposition device 10 that can be used in one embodiment. For optimizing directional gas flow in this particular embodiment, redirecting plates 38 may be positioned in each of the output channels 12 for directing reactant gaseous materials. In the embodiment shown, only output channels 12 that deliver reactant gaseous materials are provided with redirecting plates 38 and exhaust ports 26. This particular arrangement may be advantageous in some applications, where it is advantageous to surround deposition device 10 with inert gas, such as to reduce unwanted intake of ambient gases. However, redirecting plates 38 could be used on all output channels 12. Also, exhaust ports 26 could be used on some or all output channels 12. In another possible embodiment, redirecting plates can be used on all channels, but the outlet edge of the redirecting plate may be at a different x-axis position depending upon which channel is considered. In particular, it may be desirable to have the outlet edge position of the baffles 58 (as shown in FIGS. 7B and 7D) for the inert flows to be at lower x-axis positions than those of the reactant gases so that the inert purge flows can serve as mentioned above to isolate the various channels.

FIG. 9 also shows the pattern of output channels in one embodiment. Here, it has been found to be particularly advantageous to provide inert gas channels I as the outermost channels of deposition device 10. Oxidation channels with first reactant gaseous material O are next to the outermost channels, since these condition the surface for ALD reaction with the metallic component of second reactant gaseous material M.

Figure 10:
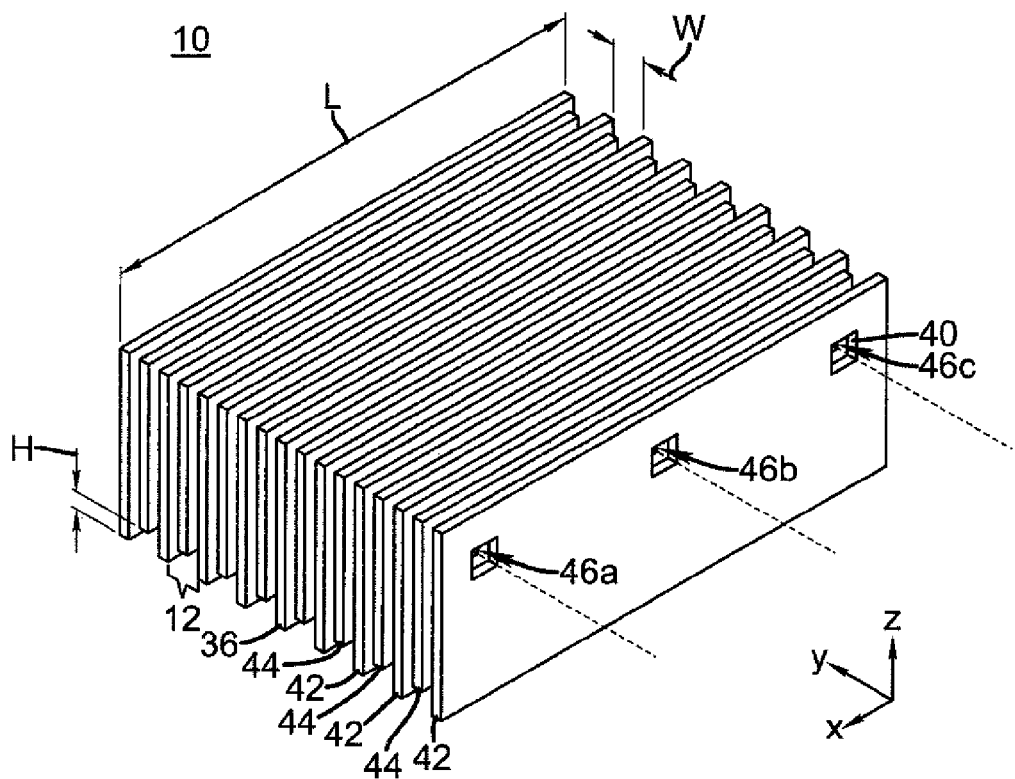
FIG. 10 is a perspective view of one embodiment of a deposition device formed from stacked plates that can be used in the present process.
Figure 11A:
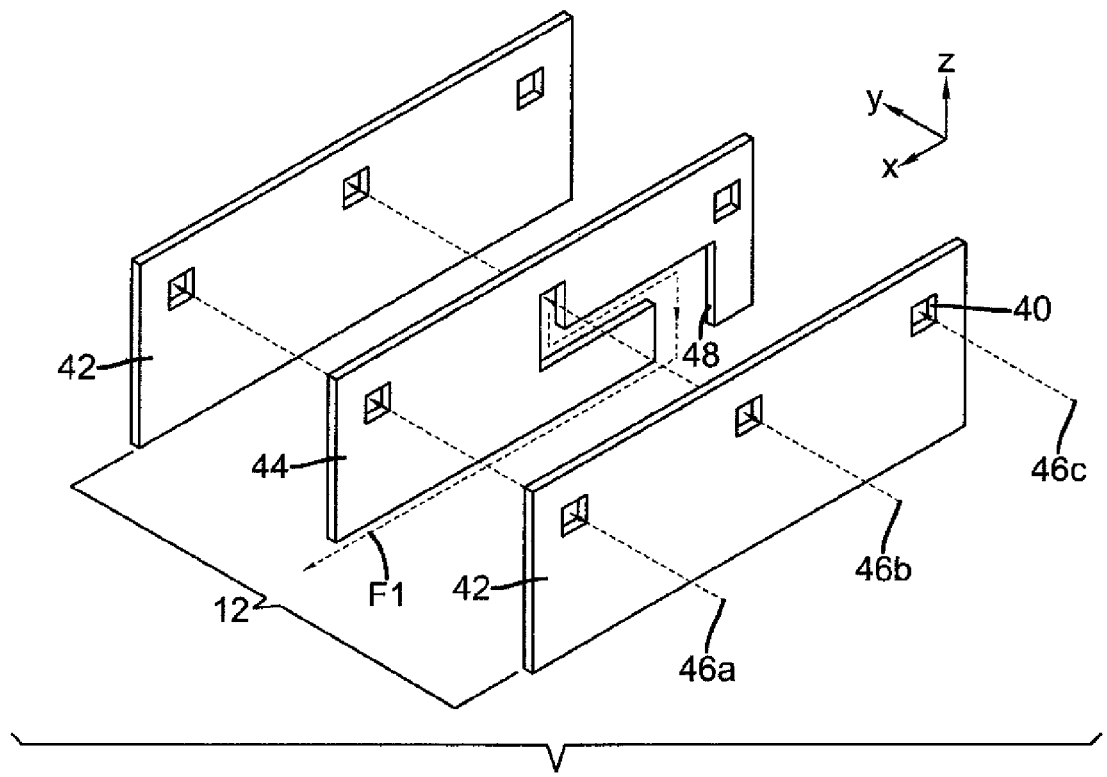
FIGS. 11A and 11B are exploded views of the construction of a deposition device that employs the stacked-plate structure shown in FIG. 10, the exploded views showing two different output channels for different gases used in the process.
Figure 11B:
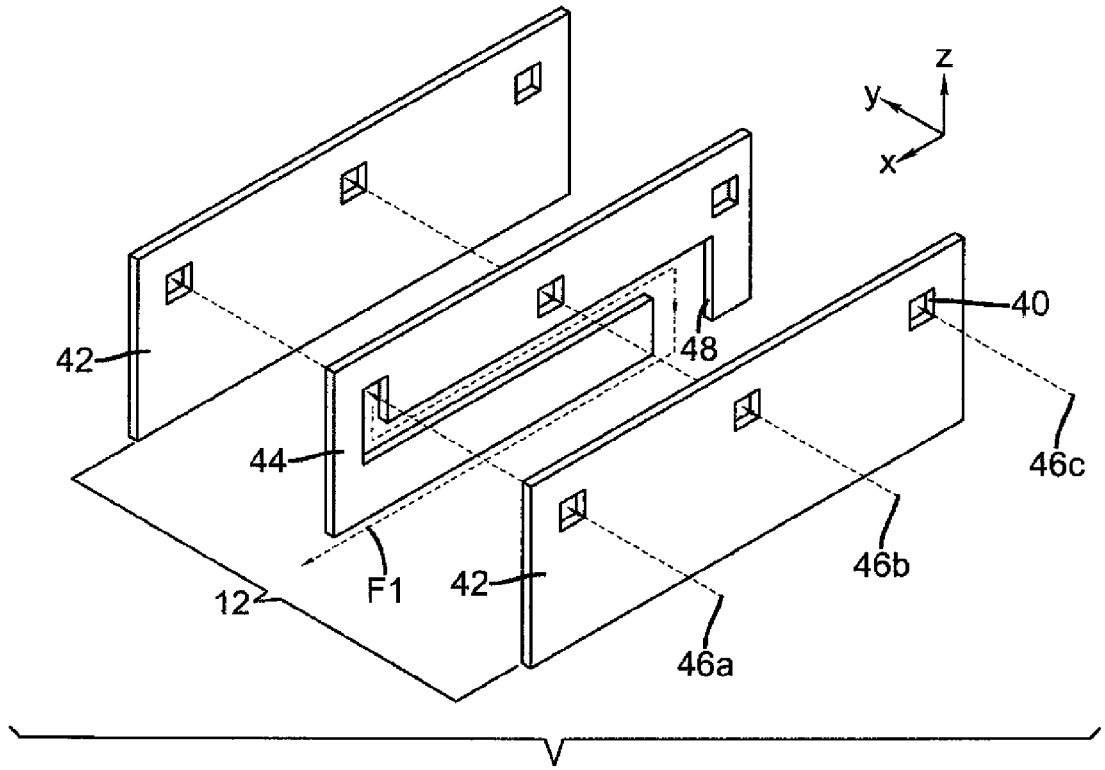

FIG. 10 shows one embodiment of a deposition device 10 that can be used in the present process in which the channels of width W, length L, and height H are formed from stacked metal plates 42 and 44 having apertures 40 forming ducts 46a,b,c. FIG. 11A shows an exploded view of a single output channel 12 section of deposition device 10 formed in this way, showing an arrangement of apertures 40 in alternating partition plates 42 and delivery plates 44. FIG. 11B shows a similar exploded view for an adjacent output channel 12. Ducts 46a, 46b, and 46c, formed by alignment of apertures 40, extend through deposition device 10 and provide input conduits for gaseous flow communication, accepting the different reactant and inert gaseous materials from external sources and providing the redirecting structures that provide gas flows along output face 36 described earlier. Baffles and other redirecting structures are not shown in these figures, but could be provided using stacked plates suitably structured, or applied after the device is assembled.

The exploded views of FIGS. 11A and 11B each show a single output channel 12 formed from stacked plates 42 and 44. In the example of FIG. 11A, output channel 12 provides gaseous material provided from duct 46b. Ducts 46a and 46c conduct other gases past this channel in the embodiment shown in FIG. 11A. Delivery plate 44, dimensioned and apertured differently than the partition plates 42 that bound output channel 12, contains a redirecting chamber 48 that redirects a portion of the gas in duct 46b into gas flow F1. In the example of FIG. 11B, output channel 12 provides gaseous material provided from duct 46a. Ducts 46b and 46c conduct other gases past this channel in the embodiment shown in FIG. 11B. Plates 42 and 44 should be of a suitable metal for conducting the reactive gaseous materials, such as stainless steel or other metal for example.

It is desirable that when a large number of plates are assembled for such an embodiment, the gas flow delivered to the substrate is uniform across all of the channels delivering a particle flow (I, M, or O). This can be accomplished by proper design of the plates, such as having restrictions in some part of the flow pattern for each plate which are accurately machined to provide a reproducible pressure drop for each channel.

Although the method of stacking plates is a particularly useful way of constructing a deposition device for use in this invention, there are a number of other methods to build such structures and may be useful in alternate embodiments of deposition devices that can be used in the present process. For example, the deposition device for use in the present process may be constructed by direct machining of a metal block, or of several metal blocks adhered together. Furthermore, molding techniques involving internal mold features can be employed, as will be understood by the skilled artisan. A deposition device can also be constructed using any of a number of stereolithography techniques.

As can be seen from the example embodiment of FIGS. 10, 11A, and 11B, deposition device 10 can be constructed of very small size, with each output channel 12 having the width of a sheet of metal plating. For example, in one embodiment using the arrangement of FIGS. 10, 11A, and 11B, output channel 12 is about 0.034 inches (0.86 mm) in width W. Output channels 12 for different materials could be fabricated at different thicknesses to obtain width W ranges, preferably from about 0.01 inches (0.25 mm) to about 0.1 inches (2.5 mm) for a compact arrangement. The length L of output channel 12 can vary, depending on the needed uniformity and desired gas pressure. In one embodiment, output channel length L is about 3 inches (75 mm). The height H of output channels 12 formed from extending portions of stacked plates 42 is about 0.1 inches in one embodiment.

Figure 12:
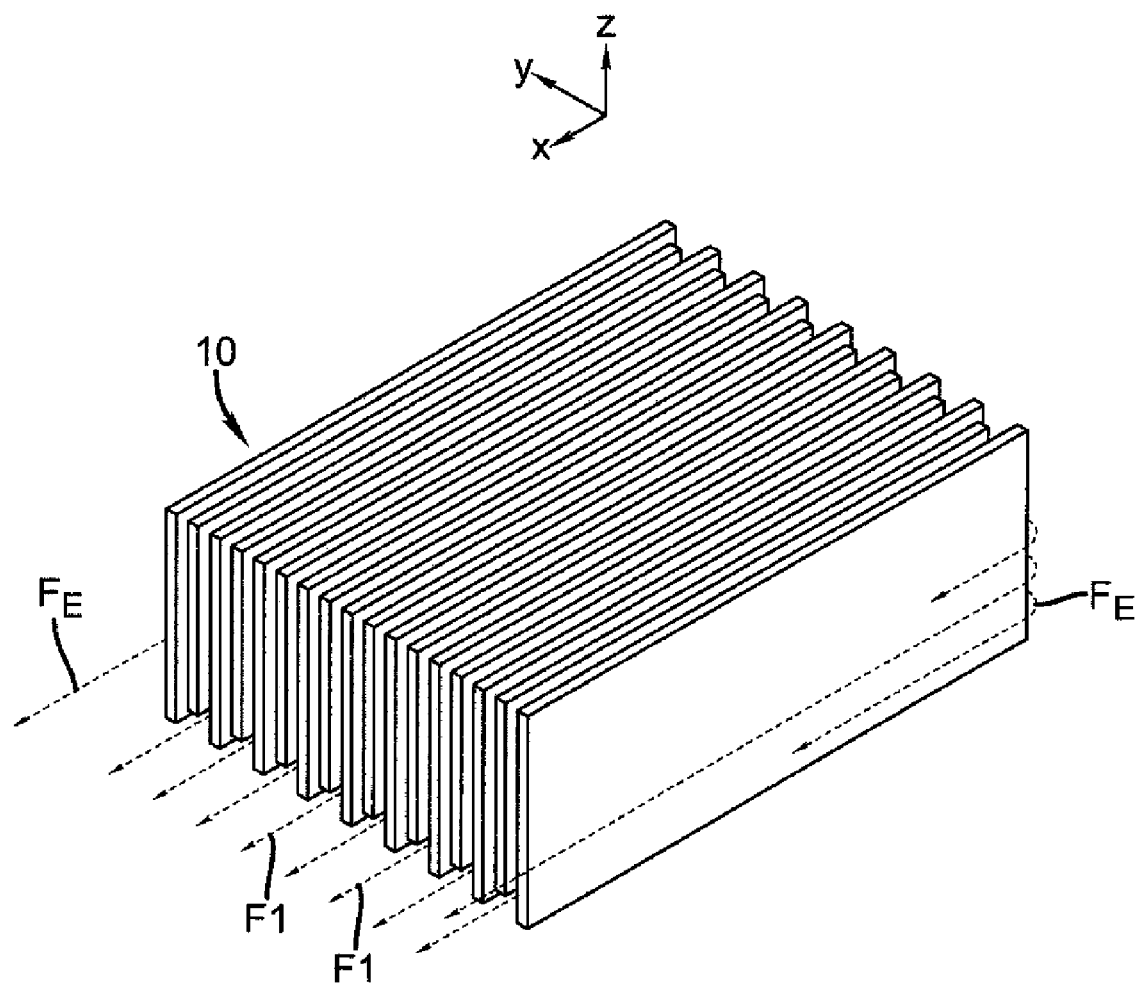
FIG. 12 is a perspective view showing an embodiment using an enveloping shroud of inert gas directed along the perimeter of the deposition device.

Because gas flow can inadvertently draw ambient gases, due to low-pressure zones that are created, it may be useful to provide additional protection barrier from an inert layer. Referring to FIG. 12, there is shown an envelopment gas flow $F_E$ by which an additional flow of inert gas is used on one or more sides of deposition device 10 to prevent ambient gases from contaminating the process gases.

As was particularly described with reference to FIGS. 4A and 4B, deposition device 10 requires movement relative to the surface of substrate 20 in order to perform its deposition function. This relative movement can be obtained in a number of ways, including movement of either or both deposition device 10 and substrate 20, such as by movement of a process that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example deposition device 10 of FIG. 9, having a nominal channel width of 0.034 inches in width W for each output channel 12, reciprocating motion (along the y axis as used herein) of at least 0.20 inches would be required. For this example, an area of substrate 20 would be exposed to both first reactant gaseous material O and second reactant gaseous material M with movement over this distance. In some cases, consideration for uniformity may require a measure of randomness to the amount of reciprocating motion in each cycle, such as to reduce edge effects or build-up along the extremes of reciprocation travel.

A deposition device 10 may have only enough output channels 12 to provide a single cycle. Alternately, deposition device 10 may have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, preferably less than 100 milliseconds. The relative movement of the substrate to a channel during oscillation is at a speed of at least 0.1 cm/sec, and the gas flow in the channels is at least 1 cm/sec. Preferably, the temperature of the substrate during deposition is under 300° C., more preferably under 250° C.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 13:
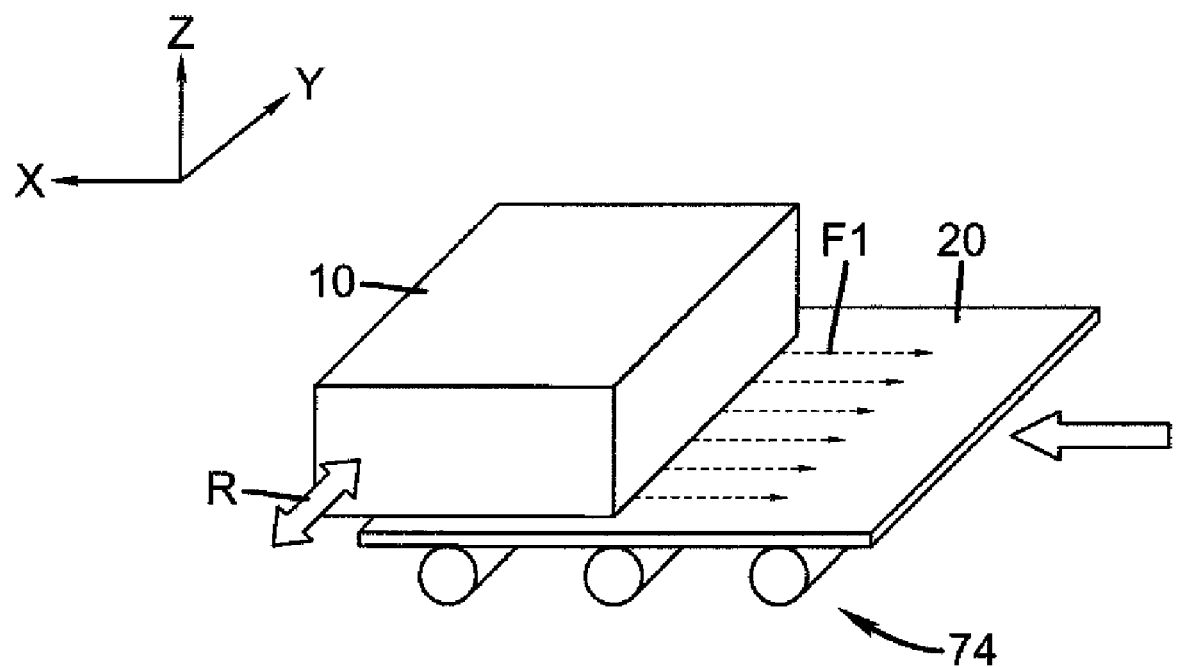
FIG. 13 is a schematic diagram showing an alternative motion pattern for reciprocating and orthogonal movement.

An advantage of the reciprocating motion used for a deposition device 10 used in one embodiment of the present process is that it allows deposition onto a substrate 20 whose area exceeds the area of output face 36. FIG. 13 shows schematically how this broader area coverage can be effected, using reciprocating motion along the y axis as shown by arrow R and also movement orthogonal or transverse to the reciprocating motion, relative to the x axis. Again, it must be emphasized that motion in either the x or y direction, as shown in FIG. 13, can be effected either by movement of deposition device 10, or by movement of substrate 20 provided with a substrate support 74 that provides movement, or by movement of both deposition device 10 and substrate 20.

In FIG. 13 the relative motion of the depositor and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the deposition device over a fixed substrate; an oscillation combined with displacement of the substrate relative to a fixed substrate deposition device; or any combinations wherein the oscillation and fixed motion are provided by movements of both substrates.

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the process of the present invention.

Figure 14:
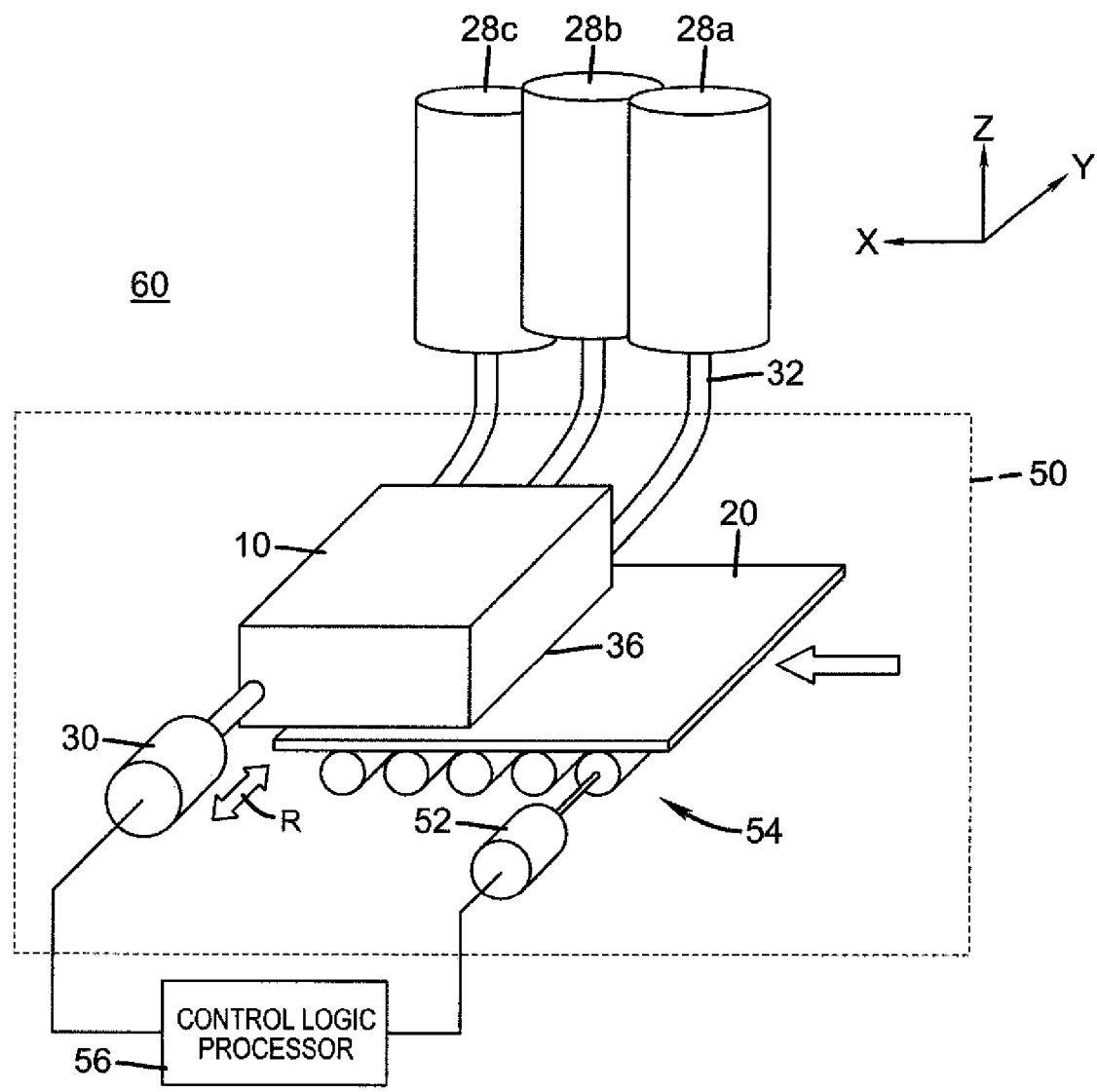
FIG. 14 is a block diagram of one embodiment of a deposition system that uses the process according to the present invention.

FIG. 14 shows an Atomic Layer Deposition (ALD) 60 process, for making a thin metal or metal oxide film, having a chamber 50 for providing a relatively well-controlled and contaminant-free environment. Gas supplies 28a, 28b, and 28c provide the first, second, and third gaseous materials to deposition device 10 through supply lines 32. The optional use of flexible supply lines 32 facilitates ease of movement of deposition device 10. For simplicity, an optional vacuum vapor recovery process and other support components are not shown in FIG. 13 but could also be used. A transport subsystem 54 provides a substrate support that conveys substrate 20 along output face 36 of deposition device 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 14, control logic processor 56 controls an actuator 30 for providing reciprocating motion to deposition device 10 and also controls a transport motor 52 of transport subsystem 54.

FIG. 15 shows an alternate embodiment of an Atomic Layer Deposition (ALD) process 70 for thin film deposition onto a web substrate 66 that is conveyed past deposition device 10 along a web conveyor 62 that acts as a substrate support. A deposition device transport 64 conveys deposition device 10 across the surface of web substrate 66 in a direction transverse to the web travel direction. In one embodiment, deposition device transport 64 uses a lead screw that traverses the width of web substrate 66. In another embodiment, multiple deposition devices 10 are used, at suitable positions along web 62.

Figure 16:
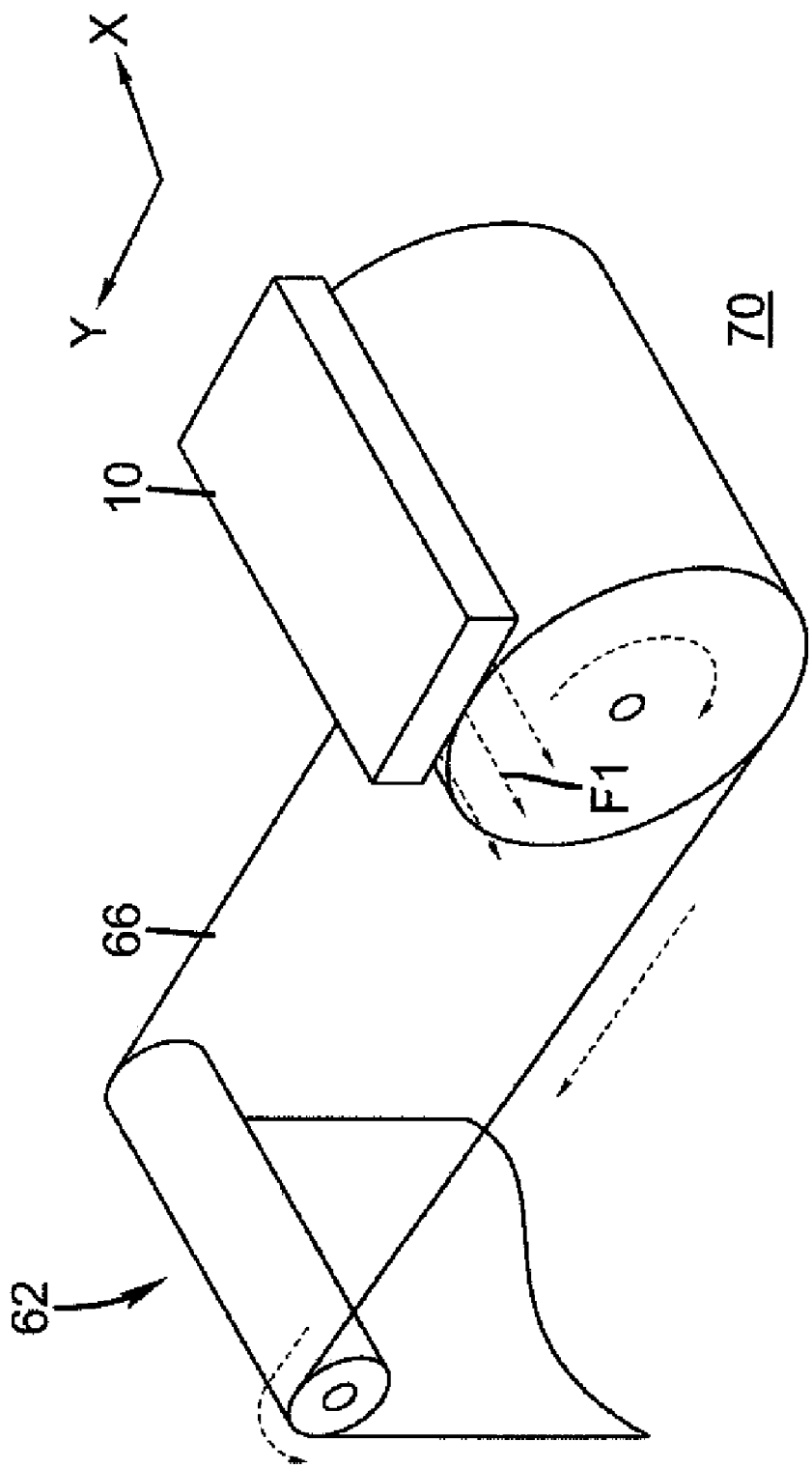
FIG. 16 is a block diagram showing another embodiment of deposition system applied to a moving web in accordance with the present process, with the deposition device stationary.
Figure 17:
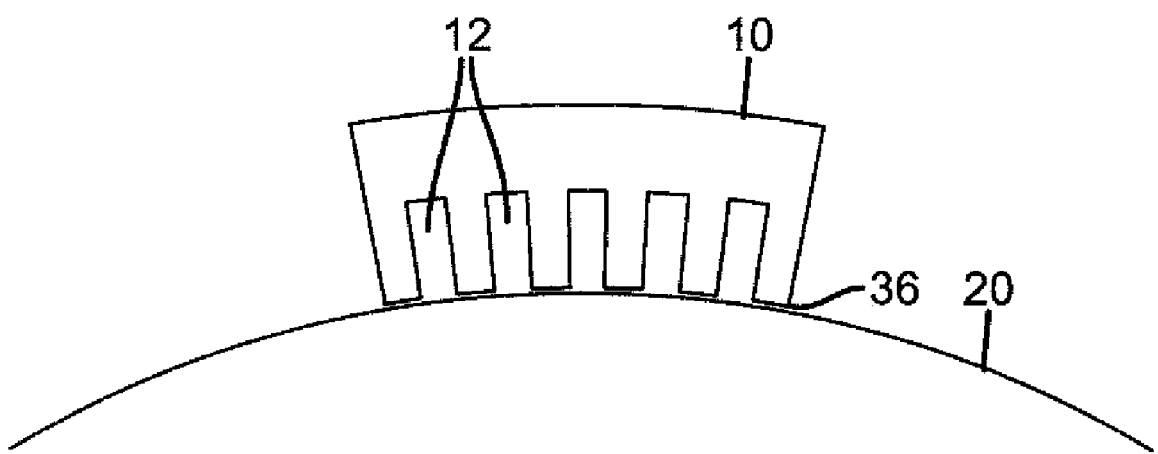
FIG. 17 is a cross-sectional side view of one embodiment of a deposition device with an output face having curvature that can be used in the present process.

FIG. 16 shows another Atomic Layer Deposition (ALD) system 70 for depositing a metal or metal oxide thin film in a web arrangement, using a stationary deposition device 10 in which the flow patterns are oriented orthogonally to the configuration of FIG. 14. In this arrangement, motion of web conveyor 62 itself provides the movement needed for ALD deposition. Reciprocating motion could also be used in this environment, such as by repeatedly reversing the direction of rotation of a web roller to move substrate 66 forward and backwards relative to deposition device 10. Reciprocation motion can also be obtained by allowing a reciprocating motion of the deposition device across an arc whose axis coincides with the roller axis, while the web is moved in a constant motion. Referring to FIG. 17, an embodiment of a portion of deposition device 10 is shown in which output face 36 has an amount of curvature, which might be advantageous for some web coating applications. Convex or concave curvature could be provided.

Optionally, the present process can be accomplished with other apparatus or systems described in more detail in U.S. Pat. Nos. 7,413,982 and 7,456,429 and U.S. Application Publication Nos. 2009/0130858 and 2008/0166884. All above-identified applications incorporated by reference in their entirety.

In the embodiments in the latter three applications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (i) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for thin-film material deposition of a zinc-oxide-based semiconductor onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; and (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated emissive channel and each second elongated emissive channel is situated between relatively nearer elongated exhaust channels and between relatively less nearer elongated emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment such a gas diffuser is capable of providing a friction factor for gaseous material passing there through that is greater than $1 \times 10^2$, thereby providing back pressure and promoting equalization of pressure where the flow of the at least one first, second and third gaseous material exits the delivery device. In one embodiment of the invention, the gas diffuser comprises a porous material through which the at least one of the first, second, and third gaseous material passes. In a second embodiment of the invention, the gas diffuser comprises a mechanically formed assembly comprising at least two elements comprising interconnected passages, for example, in which nozzles are connected to a flow path provided by a thin space between parallel surface areas in the two elements.

In one embodiment, the one or more of the gas flows from the deposition devices provides a pressure that at least contributes to the separation of the surface of the substrate from the face of the delivery head, thereby providing a "floating head" or "air bearing" type deposition head, which can help to stabilize the gas flows and limit intermixing of the gas flows.

Figure 26:
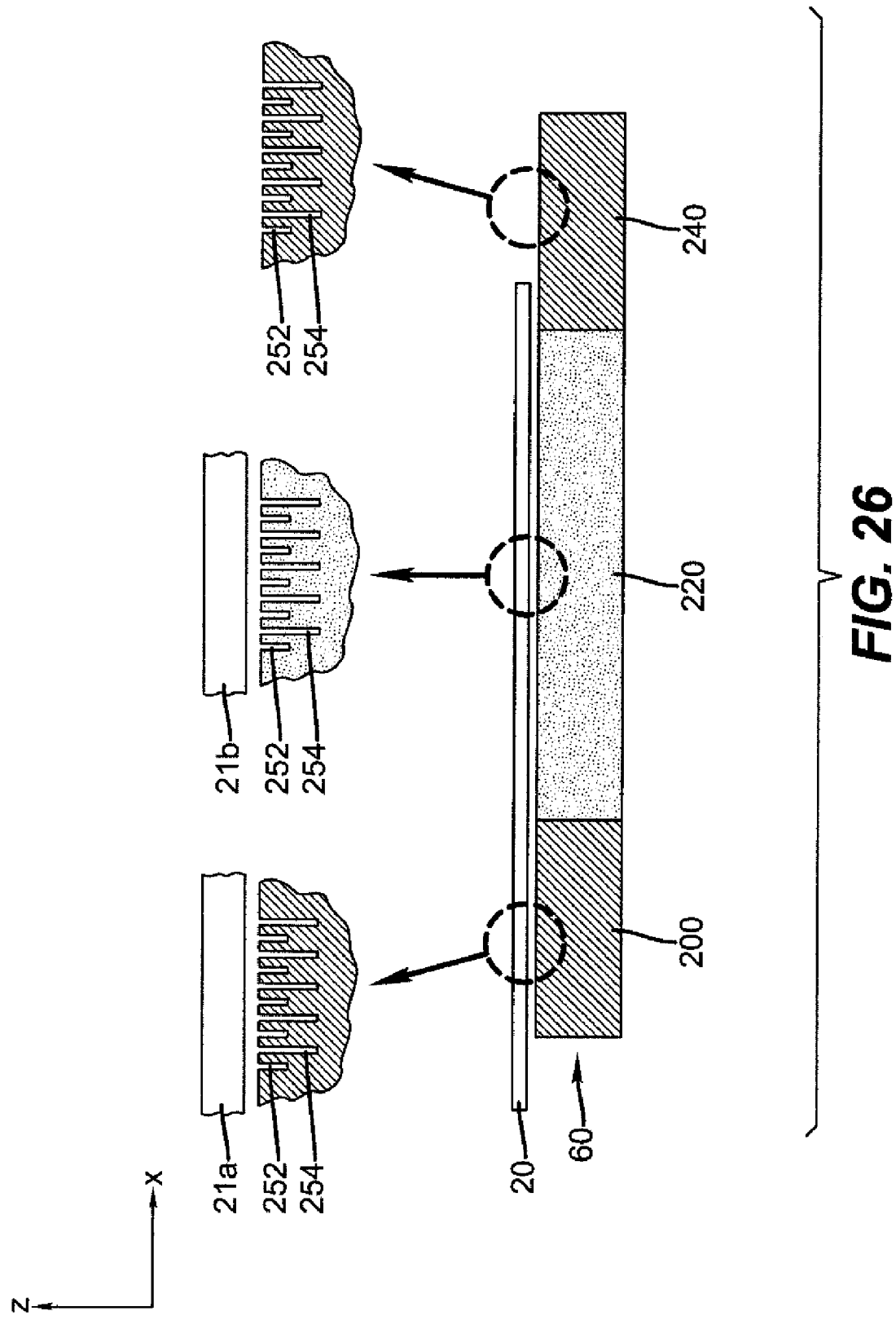
FIG. 26 is a side view of a deposition system showing the main coating section and the entrance and exit sections.

Although deposition only occurs in the areas of the deposition head which exhibit an alternating sequence of reactive gases, practical considerations dictate that a deposition system have sections adjacent to the deposition head to provide an area on which to load and unload a substrate into or out of the coating section, as well as to optionally provide support for portions of the substrate that extend past the deposition area as indicated in the deposition process 60 of FIG. 26, in which portions of the substrate 20 are shown as magnified portions 21a and 21b. For purposes of definition, the entrance section 200 is the section before the deposition or coating section 220, and the exit section 240 is the section after the deposition or coating section 220, considering the direction of substrate travel.

Since the deposition head maintains its proximity to the substrate optionally via a gas bearing effect, it is convenient that the entrance and exit sections also use a similar effect. These sections may have a distribution of gas delivery slots (or more generally, ports) that is very similar to that of the deposition section. In fact, it is possible in some circumstances that the entrance and exit slots be identical to output slots in the deposition region except that they are supplied only with a single gas.

The entrance section 200 and exit section 240 may be supplied with any gas for floatation that does not adversely impact the manufacture and performance of the thin films. In many cases, it may be desirable to use an inert gas as the flotation gas for entrance section 200 and exit section 240. Alternatively, since the substrate is likely to see air before and after deposition, there may be times when cost savings in terms of gas utilization can be achieved by using air as the floatation gas for one or both of these sections.

The entrance section 200 and exit section 240 can optionally use only a single gas supply without additional gas handling considerations. In a preferred embodiment, the non-depositing output faces of the entrance section 200 and exit section 240 have an arrangement of non-depositing output openings 252 supplying gas to the non-depositing output face of the entrance or exit section and an arrangement of gas exhaust ports 254 withdrawing gas from the surface of the non-depositing output face. The use of exhaust ports 254 allows for more robust positioning of the substrate and maintenance of an appropriate gap between the substrate and the non-depositing output face.

As indicated above, for the entrance section 200 and exit section 240 the non-depositing output face may have output openings 252 and exhaust ports 254 that may take the form of slots as envisioned for the deposition or coating sections. However, these openings may be of any convenient shape since containment or separation of gas from one type of opening to another is not required in these sections, as compared to the coating section. Examples of other types of openings would be square, pentagonal, or preferably circular openings, just to name a few.

In the case where the non-depositing output openings 252 and exhaust ports 254 are slots, the preferred arrangement of slots would be to have each exhaust port or channel 254 surrounded on each side by non-depositing output openings 252, and likewise at each non-depositing output opening 252 surrounded on each side by exhaust ports 254. In a preferred embodiment, the openings at the furthest ends of the entrance and exit sections would be non-depositing output openings. In the case where non-depositing output openings 252 and exhaust ports 254 are circular openings, these could be disposed in any manner that provides an alternation of said types of openings. One preferred arrangement would be holes on a square pattern in which each output opening 252 is surrounded by its nearest neighbors with exhaust ports 254, and likewise each exhaust port surrounded by non-depositing output opening 252.

Alternately, the entrance and exit sections could employ porous materials to deliver gases to the non-depositing output face.

The entrance, exit, and coating sections may be maintained at a specified, pre-selected temperature or temperature range, optionally with different temperature set points for each of the sections.

Any manner in which a substrate can be repeatedly exposed to the alternating sequence of gases from the coating head will cause the ALD growth of a film. A reciprocation motion has been envisioned in the prior art for such a growth. However, reciprocating motion involves a complex mechanical system to allow for substrate loading and repeated reversing of substrate direction. A less obvious but still significant problem with the reciprocating motion is that at least a portion of the substrate during it growth must be withdrawn from the deposition area between each stroke, leading to the exposure of the withdrawn regions to a possibly uncontrolled environment.

The present solution to the above problem involves designing the coating or delivery head with enough ALD cycles that a substrate need only make a single pass, or at most a single bi-directional pass, through the coating region in order to receive the required amount of deposition for a particular thin film. It can be seen that in such a configuration, the entire ALD growth at any location on the substrate can be accomplished, in one preferred embodiment, without any need to cause a reversal in direction of the substrate for deposition purposes.

Again with reference to the deposition system 60 of the embodiment of FIG. 26, a complete thin film layer of a desired thickness can be formed by loading the substrate into the entrance section 200, transporting the substrate through the entrance section 200, to and through the coating section 220, continuing to transport the substrate into the exit section 240 wherein the substrate 20 may be removed with the completed thin film. This has the additional advantage that there is no reason for the substrate to be removed from the coating area prior to the completion of the desired layer thickness. In addition to avoiding any exposure to an uncontrolled environment, the continuous growth in a single pass should increase the overall deposition rate on any given point on the substrate.

Another advantage of the above unidirectional motion is simplification of the mechanical systems required for substrate transport. Substrate transport can be accomplished with the use of any sort of device causing linear motion, such as a linear motor driven linear stage, a rotary motor driven linear stage, a belt drive, or any other methods of introducing linear motion as known by a skilled artisan. Non-contact methods to provide movement of the substrate could also be accomplished. Such methods include viscous forces, such as directed gas streams, magnetic, and electrical forces.

Because the system does not require any change in direction of the substrate, and the gas bearing effect produces low friction, travel of the substrate through the deposition zone can also be accomplished by providing the substrate with an initial velocity and then allowing the substrate to glide by its own inertia though the deposition zone, at least to some extent. An initial velocity to the substrate could be imparted by any of the motion methods discussed above.

It is also possible that the substrate velocity be imparted by the effect of gravity. Thus, the coating, entrance, and exit sections may be inclined to allow gravity feed to accomplish part or all of the motion of the substrate. Furthermore, the degree of incline of these sections may be variable mechanically such that during the course of a deposition a stationary substrate could be accelerated by changing the incline of the coating section, entrance section, or exit section from horizontal to some level of incline.

Although a unidirectional single pass deposition system may be preferred for simplicity of substrate transport, a bi-directional system may be preferred for a deposition system with a smaller foot-print. In the case of a bi-directional system, the entrance and exit section would be of similar length to that of the unidirectional system, but the coating section would only need to be half the length, relatively speaking. Again referring to FIG. 26, a complete thin film layer of desired thickness, in such an embodiment, would be formed by loading the substrate 20 into the entrance section 200, transporting the substrate through the entrance section 200, to and through the coating section 220, continuing to transport the substrate into the exit section 240, wherein the substrate transport direction would be reversed and the substrate would be transported back through the coating section 220, into entrance section 200 where the substrate may be removed with the completed thin film.

The coating section 220, entrance section 200, and exit section 240 of the current invention are complex mechanical systems with a high number of internal passageways and depositing output face openings. Often these systems will be constructed of a large number of bonded parts. Furthermore, in order to achieve a single pass deposition, the length of the coating section and number of depositing output face slots can be quite large. For example, a single deposition cycle may require eight elongated slots: Purge—Exhaust—First Reactive Gas—Exhaust—Purge—Exhaust—Second Reactive Gas—Exhaust. If it is assumed that a single deposition cycle produces 1 Å of layer thickness, then to achieve 1000 Å of layer thickness would require 1000 of the above cycles. If we further assume that each of the elongated slots is separated from its neighbor by 0.025 inches, then the total length of the deposition zone would be 16.7 feet. Furthermore, if the entrance section and exit section need to be at some reasonable length to support the substrate, these sections could easily exceed 5 feet in length.

Creating such a large deposition region may be difficult to achieve by creating a single monolithic deposition device. The difficulty arises from several factors. First of all such long heads will be composed of thousands of parts, and a successfully constructed head will require assembling this large number of parts without significant or unacceptable defects. Furthermore, there may be significant problems in mounting and handling a very large head into the overall deposition system. Finally, if the head is damaged in operation, replacing a single large head will be very costly and time consuming.

Figure 27:
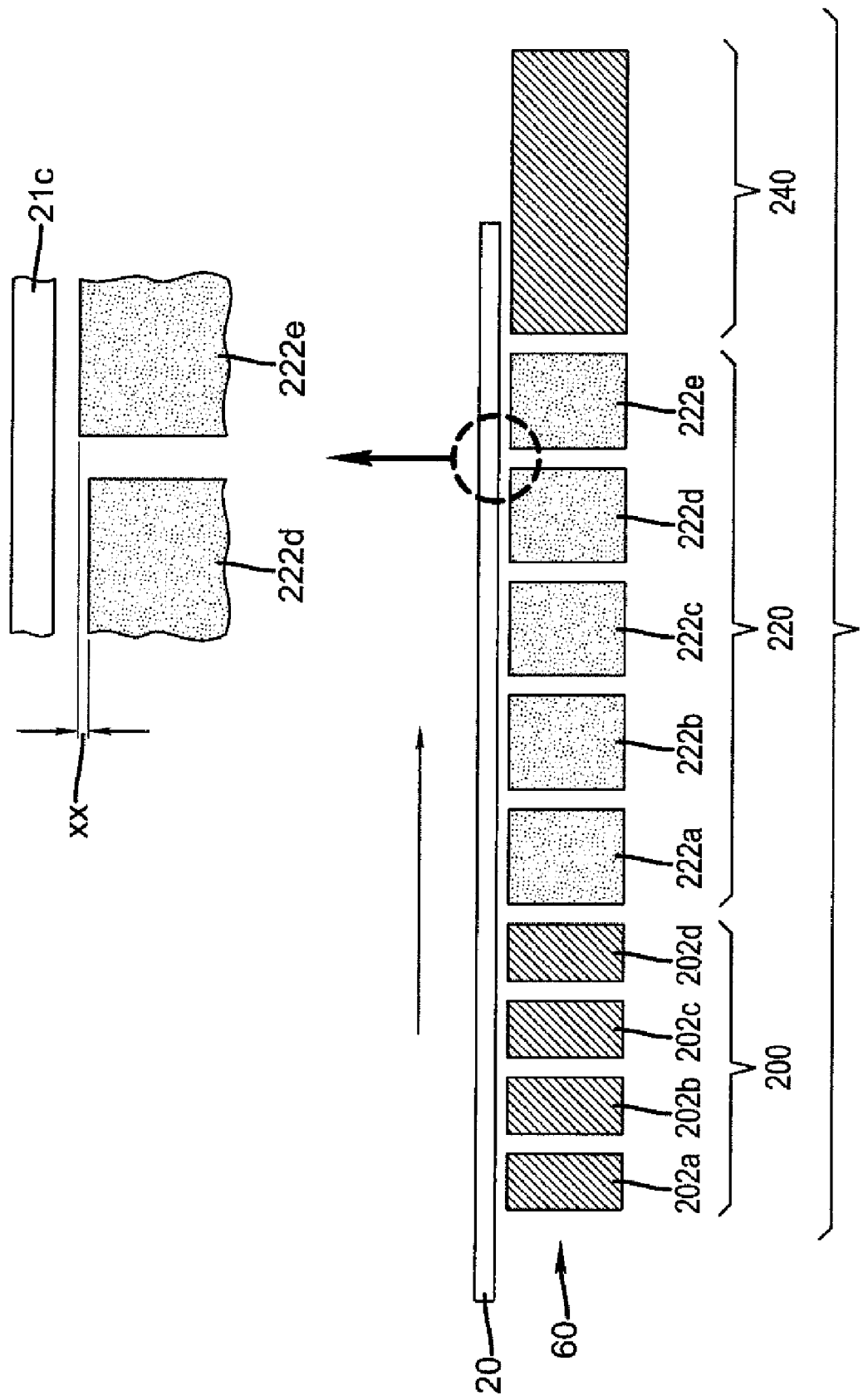
FIG. 27 is a perspective view showing a deposition system containing modules consistent with the present invention.

An alternative to the single large deposition head is to construct the head of independent modules. A module can represent a full section, such as the entrance, exit, or coating section. Alternatively, a given section can be constructed from a number of modules. FIG. 27 shows a view of one embodiment involving modular configuration. In FIG. 27, the entrance section 200 is composed of 4 modules 202a, 202b, 202c and 202d. The coating section 220 of deposition system 60 is composed of 5 modules 222a, 222b, 222c, 222d, and 222e. A magnified portion of the coating section shows the vicinity of two modules to a substrate portion 21c, in which the variation in the placement of the faces of the modules, with respect to the substrate, are kept within a maximum desired variation of distance xx for improved results. These coating section modules may be identical or different, depending on the design of the final deposition system 60. For practical purposes, each of a plurality of coating section modules minimally contain the appropriate number of output openings and exhaust ports to complete a single ALD cycle. Preferably, the modules would be designed for one to fifty complete ALD cycles. FIG. 27 shows an exit section 240 composed of a single module. It should be understood by one skilled in the art that many combinations of modules are available for construction of a final deposition system, and FIG. 27 merely serves to illustrate one illustrative embodiment or possible arrangement, which will, of course depend on, and be adapted to, the particular substrate being coated, the particular process, the materials and thin films that are involved, and the particular type of device being manufactured.

In one preferred embodiment, the deposition system can comprise, for example, eight or more modules in the coating section, preferably 10 to 100 modules. Each of such modules can comprises a delivery head that is substantially separately and independently constructed, assembled, and placed in the deposition system.

To understand how the number of modules can impact the yield in constructing the coating section, consider the example of a coating section that is composed of 8000 plates. Assume that, in assembly, there is a defect rate such that in assembling every 200 plates there is a 2% chance of having a defect in the assembly. In assembling this section as modules of 200 plates each, there will be required 40 working modules, and therefore approximately 41 modules will need to be assembled to yield 40 usable modules (approximately 2% wasted work). To attempt a single construction of 8000 plates, the probability of a single construction working is $0.98^{40}=44\%$. As a result, approximately 2 full coating sections will be required to yield a single working section (approximately 50% wasted work). The present modular aspect in one embodiment of the invention can significantly avoid or reduce that problem.

In a preferred embodiment, the coating, entrance, and exit sections of the present invention all operate with a gas bearing effect. As such, the separation between the substrate and the deposition device can be very small, sometimes as low as 10 microns. It is therefore very important that the depositing output faces of sections have surfaces free of discontinuities. In a modular configuration, the modules of a section, illustrated with the coating section of FIG. 27, must have well aligned depositing output faces. The distance xx of the inset of FIG. 27 needs to be small in order to accomplish this alignment and have a very low mismatch in location/height. The distance xx should be less than 10 microns, preferably less than 5, even more preferably less than 2.

There are a number of ways to achieve a suitable height positioning of the modules. The modules can individually be mounted upon a position adjusting means and upon installation of a given module, the position adjusting means can be used to adjust the height of the depositing output face to some desired position. Examples of height adjusting means are rotary micrometer positioners, piezoelectric positioners, and other means known in the art.

Figure 28:
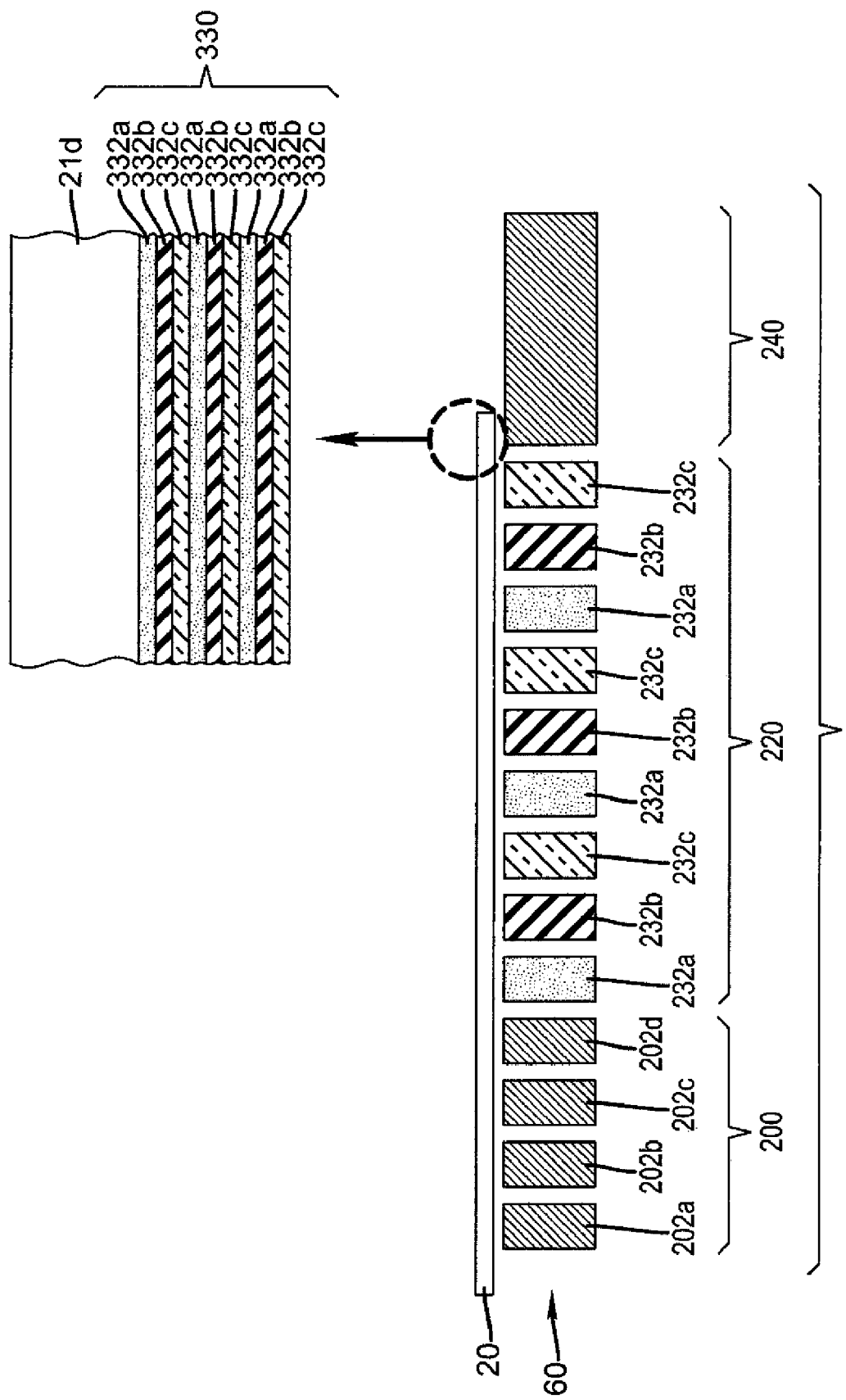
FIG. 28 is a perspective view illustrating the formation of thin films using one embodiment of the inventive deposition system.

Often it is desired to coat a thin film consisting of a single material. There are however desirable thin films in which a complete film containing a number of layers of different materials can be useful. It is possible in the case of a modular coating section that a plurality of modules within the coating section are capable of delivering the different gases, thus not all modules produce the same coatings. FIG. 28 illustrates one embodiment of a deposition system 60 in which the modules of the coating section deliver different deposition chemistries. Coating section 220 is composed of nine modules. Module 232a is adapted to deliver chemistry to form a first thin film material, module 232b is adapted to deliver chemistry to form a second thin film material, and module 232c is adapted to deliver chemistry to form third thin film material. Modules 232a, 232b, and 232c are arranged such that the complete thin film coating entering the exit section 240 contains alternating thin film layers of, respectively, first thin film material 332a, second thin film material 332b, and third thin film material 332c in overall multiple thin film structure 330, shown with respect to substrate portion 21d. The thickness of each of these layers is determined by the number of ALD cycles within the corresponding module of coating section 220. It should be understood by one skilled in the art that the first, second and third materials could be any material that can suitably be deposited using this ALD deposition system as has been previously described. FIG. 28 should not be considered limiting, rather it should serve as one possible construction for forming a multilayer thin film. The exit section 240 and modules 202a to 202d in the entrance section 200, in FIG. 28, are similar to those explained in previous figures.

The process of the present invention is advantaged in its capability to perform deposition onto a substrate over a broad range of temperatures, including room or near-room temperature in some embodiments. The process of the present invention can operate in a vacuum environment, but is particularly well suited for operation at or near atmospheric pressure.

The production of thin film transistors and electronic devices from the ALD deposited semiconductor, dielectric, conductive and protective materials can be accomplished by conventional techniques known to the skilled artisan. In one embodiment, a substrate is provided, a film or layer of the active material as described above can be applied to the substrate, and electrical contacts made to the layer. The exact process sequence is determined by the structure of the desired transistor. Thus, in the production of a field effect transistor, for example, a gate electrode can be first deposited on a substrate, for example a vacuum or solution deposited metal or organic conductor, or an ALD deposited conductor. The gate electrode can then be insulated with a dielectric and then source and drain electrodes and a layer of the n-channel semiconductor material can be applied on top. The structure of such a transistor and hence the sequence of its production can be varied in the customary manner known to a person skilled in the art. Thus, alternatively, a gate electrode can be deposited first, followed by a gate dielectric, then the semiconductor can be applied, and finally the contacts for the source electrode and drain electrode deposited on the semiconductor layer. A third structure could have the source and drain electrodes deposited first, then the semiconductor, with dielectric and gate electrode deposited on top.

The skilled artisan will recognize other structures can be constructed and/or intermediate surface modifying layers can be interposed between the above-described components of the thin film transistor. In most embodiments, a field effect transistor comprises an insulating layer, a gate electrode, a semiconductor layer comprising a ZnO material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer, and the source electrode and the drain electrode both contact the semiconductor layer.

Techniques for fabricating these structures include selective deposition, sequential masking, photolithography, laser, and/or other means known to the skilled artisan.

A thin film transistor (TFT) is an active device, which is the building block for electronic circuits that switch and amplify electronic signals. Attractive TFT device characteristics include a high ratio of the on current to the off current, and a steep subthreshold slope. In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (see Sze in *Semiconductor Devices—Physics and Technology*, John Wiley & Sons (1981)):

$$I_d = \frac{W}{2L}\mu C_{ox}(V_g - V_{th})^2$$

where $I_d$ is the saturation source-drain current, C is the geometric gate capacitance, associated with the insulating layer, W and L are physical device dimensions, $\mu$ is the carrier (hole or electron) mobility in the zinc-oxide-based semiconductor, and $V_g$ is the applied gate voltage, and $V_{th}$ is the threshold voltage. Ideally, the TFT allows passage of current only when a gate voltage of appropriate polarity is applied. However, with zero gate voltage, the "off" current between source and drain will depend on the intrinsic conductivity $\sigma$ of the zinc-oxide-based semiconductor, $$\sigma = nq\mu$$

where n is the charge carrier density and q is the charge, so that $$(I_{sd}) = \sigma(Wt/L)V_{sd} @ V_g=0$$

wherein t is the zinc-oxide-based semiconductor layer thickness and $V_{sd}$ is the voltage applied between source and drain. Therefore, for the TFT to operate as a good electronic switch, e.g. in a display, with a high on/off current ratio, the semiconductor needs to have high carrier mobility but very small intrinsic conductivity, or equivalently, a low charge carrier density. On/off ratios >$10^4$ are desirable for practical devices.

The TFT structure described herein includes a metal-oxide-based semiconductor or channel with conducting electrodes, commonly referred to as a source and a drain, for injecting a current into the semiconductor and a capacitance charge injection scheme for controlling and/or modulating the source-drain current. One particularly attractive application of metal-oxide-based semiconductor TFT's is in the drive circuits for displays on flexible, polymer substrates. Metal oxide semiconductor transistors and/or transistor arrays are useful in applications including, but not limited to, flat panel displays such as active matrix imagers, sensors, rf price labels, electronic paper systems, rf identification tags and rf inventory tags.

The present invention is preferably used for making an "enhancement-mode transistor" which means a transistor in which there is negligible off-current flow, relative to on-current flow, between a source and a drain at zero gate voltage. In other words, the transistor device is "normally off." (In contrast, a depletion-mode transistor is "normally on" meaning that more than a substantially negligible current flows between a source and a drain at zero gate voltage. Enhancement-mode devices are typically preferred.)

Turning now to FIGS. 20 to 25, with reference to these particular Figures, the terms "over," "above," "under," and the like, with respect to layers in the thin film transistor, refer to the order of the layers, wherein the thin film semiconductor layer is above the gate electrode, but do not necessarily indicate that the layers are immediately adjacent or that there are no intermediate layers. Also the descriptors "top" and "bottom" refer to the disposition of the contact with respect to the semiconductor, with bottom representing closer to the substrate and top representing further from the substrate. "Vertical" means substantially perpendicular to the surface of a substrate.

Described in the embodiments of FIGS. 20 to 25 are field effect transistors wherein at least a portion of the transistor structure may be substantially transparent. Accordingly, an optional characteristic of a transistor structure made using the present invention is that selected embodiments of the construct, or a subset thereof that include the semiconductor channel layer and the gate insulator layer, may exhibit an optical transmission of at least about 90%, more particularly at least about 95%, across the visible portion (and/or infrared portion in certain variants) of the electromagnetic spectrum. Each of the additional components of the structure (i.e., substrate, gate electrode, source/drain terminals) may be optionally opaque or substantially transparent depending upon the desired end use of the transistor. In certain embodiments, the transistor structure as a whole (and/or individual components of the transistor) may exhibit an optical transmission of at least about 50%, more particularly at least about 70%, and most particularly at least about 90%, across the visible portion (and/or infrared portion in certain variants) of the electromagnetic spectrum. Because of the optional transparency, transistors made according to the present invention may be advantageously included in optoelectronic display devices as switches coupled to at least one display element, as described in greater detail below.

Figure 20:
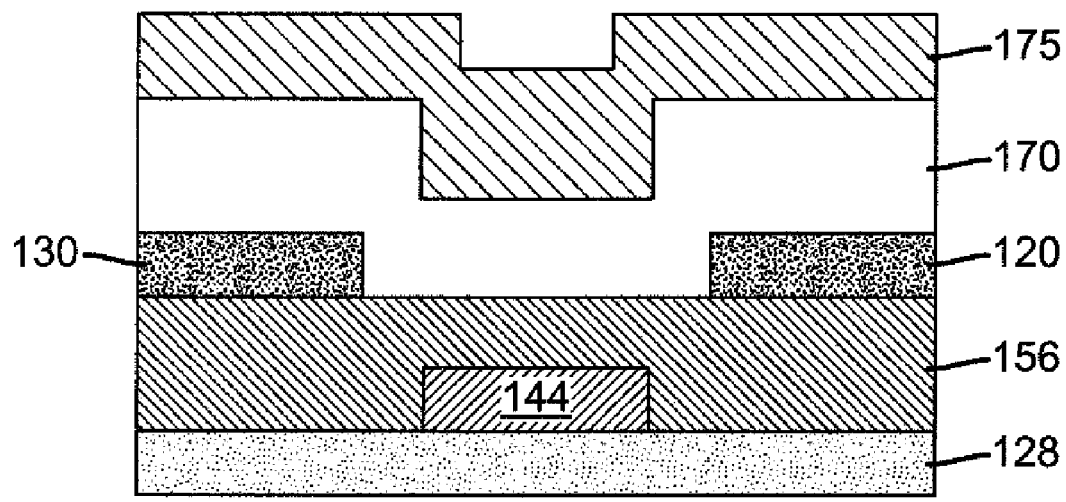
FIG. 20 illustrates a cross-sectional view of a typical thin film transistor having a bottom-gate/bottom-contact configuration.
Figure 21:
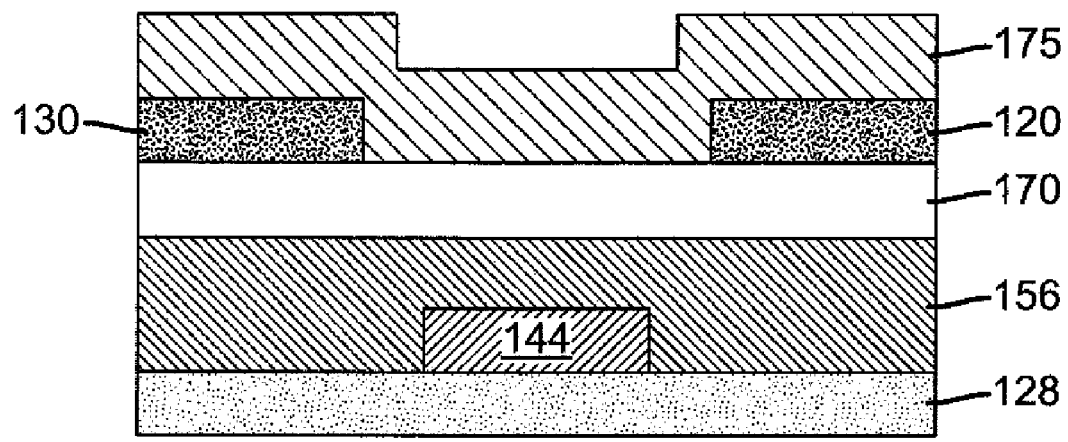
FIG. 21 illustrates a cross-sectional view of a typical thin film transistor having a bottom-gate/top-contact configuration.

Cross-sectional views of typical deposited thin film transistors are shown in FIGS. 20-25. For example, FIG. 20 illustrates a typical bottom contact configuration, and FIG. 21 illustrates a typical top contact configuration.

Each thin film transistor (TFT) in the embodiments of FIGS. 20 and 21 contains a protective layer 175, a source electrode 120, a drain electrode 130, a gate electrode 144, a gate dielectric 156, a substrate 128, and the semiconductor 170 of the invention in the form of a film connecting the source electrode 120 to drain electrode 130. When the TFT operates in an enhancement-mode, the charges injected from the source electrode into the semiconductor are mobile and a current flows from source to drain, mainly in a thin channel region within about 100 Angstroms of the semiconductor-dielectric interface. See A. Dodabalapur, L. Torsi H. E. Katz, *Science* 1995, 268, 270, hereby incorporated by reference. In the configuration of FIG. 20, the charge need only be injected laterally from the source electrode 120 to form the channel. In the absence of a gate field the channel ideally has few charge carriers; as a result there is ideally no source-drain conduction when the device is in off mode.

The off current is defined as the current flowing between the source electrode 120 and the drain electrode 130 when charge has not been intentionally injected into the channel by the application of a gate voltage. This occurs for a gate-source voltage more negative, assuming an n-channel, than a certain voltage known as the threshold voltage. See Sze in *Semiconductor Devices—Physics and Technology*, John Wiley & Sons (1981), pages 438-443. The on current is defined as the current flowing between the source electrode 120 and the drain electrode 130 when charge carriers have been accumulated intentionally in the channel by application of an appropriate voltage to the gate electrode 144, and the channel is conducting. For an n-channel accumulation-mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 144 across the gate dielectric 156 to the semiconductor-dielectric interface, effectively charging a capacitor.

Figure 22:
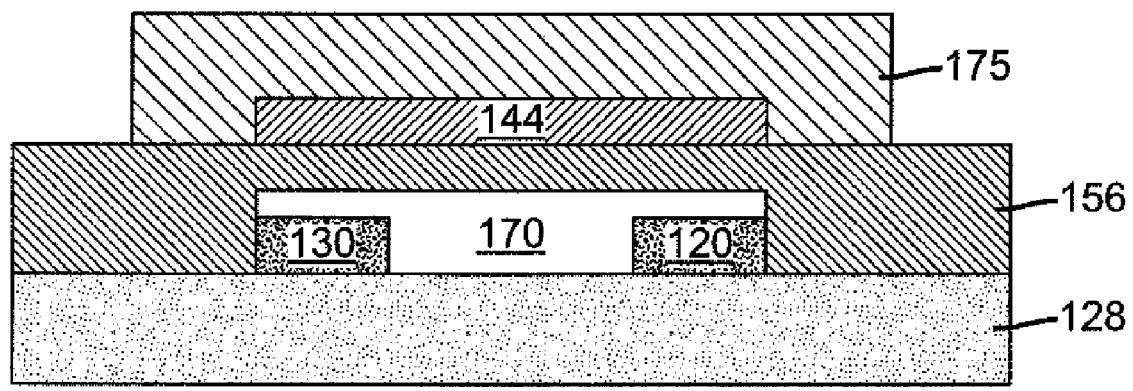
FIG. 22 illustrates a cross-sectional view of a typical thin film transistor having a top-gate/bottom-contact structure.

The specific examples of transistor configurations described herein are for illustrative purposes and should not be considered as limiting the scope of the appended claims. For example, a further (third) specific transistor structure is shown in FIG. 22, in which a third variation of a TFT structure includes an insulating substrate 128 upon which is disposed a source electrode 120 and a drain electrode 130. A semiconductor film 170 is provided such that contact between the source and drain electrodes is made. A gate electrode 144 is disposed on the top surface (from a vertical perspective) of the gate dielectric 156. In other words, the gate electrode 144 and the semiconductor film 170 are provided on opposing surfaces of the gate dielectric 156. A protective layer 175 is provided over the transistor structure.

Figure 23:
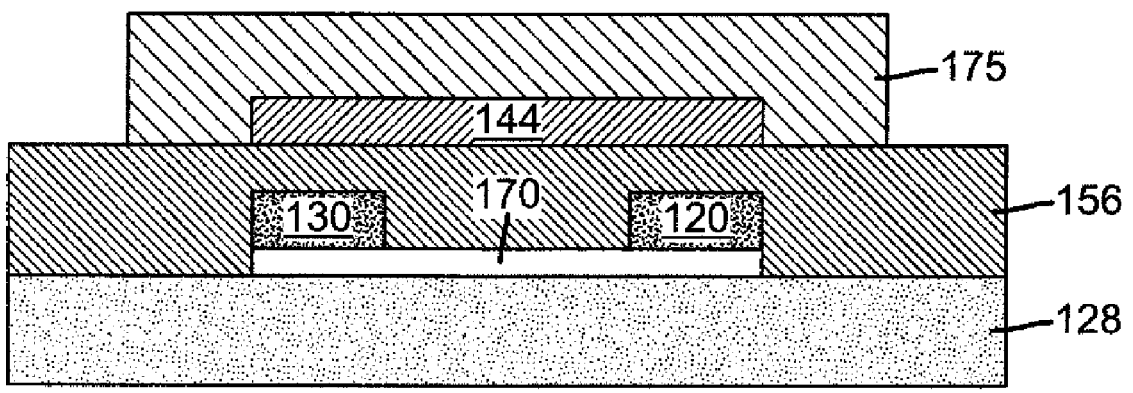
FIG. 23 illustrates a cross-sectional view of a typical thin film transistor having a top-gate/top-contact structure.

Yet a fourth variation of a TFT structure is shown in FIG. 23. This TFT structure includes a glass substrate 128 upon which is disposed a semiconductor channel layer 170. A source electrode 120 and a drain electrode 130 are provided on a surface of the semiconductor channel layer 170 opposing the surface that is adjacent to the glass substrate 128. A gate dielectric 156 is disposed over the semiconductor channel layer 170, the source electrode 120, and the drain electrode 130. A gate electrode 144 is disposed on the top surface (from a vertical perspective) of the gate dielectric 156. In other words, the gate electrode 144 and the semiconductor channel layer 170 are provided on opposing surfaces of the gate dielectric 156. A protective layer 175 is provided over the transistor structure.

The TFT structure of FIG. 23 may be fabricated, for example, by the deposition and patterning of a film that defines the semiconductor channel layer 170. For instance, a 500-Angstrom ZnO-based film may be deposited, and patterned via photolithography. The source electrode 120 and the drain electrode 130 may then be deposited and patterned. For example, a 500-Angstrom Aluminum or Indium-doped zinc oxide or Aluminum or Silver, or other metal source/drain electrode film may be deposited in the desired pattern. Subsequently, the gate dielectric 156 may then be deposited and patterned over the semiconductor channel layer 170, the source electrode 120, and the drain electrode 130. For example, a 2000 Ångstrom alumina dielectric may be deposited and patterned or selectively deposited. Vias (not shown) may be formed through the gate dielectric 156 to electrically connect to the source electrode 120 and the drain electrode 130. The gate electrode 144 may then be deposited and patterned over the gate dielectric 156. For example, a 2000 Ångstrom aluminum or indium-doped zinc oxide or ITO or metal film may be deposited and/or patterned. A protective layer 175 may then be deposited and patterned over the transistor structure. Vias (not shown) may be formed through the protective layer to electrically connect to the source electrode 120, the gate electrode 144 and the drain electrode 130. For example, a 2000 Ångstrom alumina protective layer may be deposited and patterned or selectively deposited.

Alternatively, the contacts in the above configuration of FIG. 23 may be made by selectively doping the ends of the semiconductor channel layer with In, Al, Ga, or any other suitable n-type dopant.

A support for supporting the TFT during manufacturing, testing, and/or use can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). Flexible substrates can also be thin metal foils such as stainless steel provided they are coated with an insulating layer to electrically isolate the thin film transistor. A flexible support, in some embodiments of the present invention, allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself. However, if flexibility is not a concern, then the substrate may be a wafer or sheet made of materials including glass and silicon. The thickness of the substrate may vary, and according to particular examples it can range from about 100 µm to about 1 cm.

In some embodiments of the invention, the support may be optional. For example, in a top construction as in FIG. 21, when the gate electrode and/or gate dielectric provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, e.g., manufacturing, transport, testing, and/or storage. For example, a flexible polymeric support may be adhered to a rigid glass support, from which support could be removed.

The gate electrode can be any useful conductive material. A variety of gate materials known in the art, are also suitable, including metals, degenerately doped semiconductors, conducting polymers, and printable materials such as carbon ink, silver-epoxy, or sinterable metal nanoparticle suspensions. For example, the gate electrode may comprise doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, $SnO_2$, or $In_2O_3$. Conductive polymers also can be used, for example polyaniline, poly(3,4-ethylenedioxythiophene)/poly(styrene sulfonate) (PEDOT:PSS). In addition, alloys, combinations, and multilayers of these materials may be useful. In a preferred embodiment of the present invention the gate electrode comprises a conducting oxide or metal and is deposited by the same ALD method used to deposit the semiconducting layer.

The thickness of the gate electrode may vary, and according to particular examples it can range from about 50 to about 1000 nm. The gate electrode may be introduced into the structure by chemical vapor deposition, sputtering, evaporation and/or doping, or solution processing.

The same material can provide the gate electrode function and also provide the support function of the support. For example, doped silicon can function as the gate electrode and support the TFT.

The gate dielectric is provided in contact with the gate electrode. This gate dielectric electrically insulates the gate electrode from the balance of the TFT device. Thus, the gate dielectric comprises an electrically insulating material. The gate dielectric should have a suitable dielectric constant that can vary widely depending on the particular device and circumstance of use. For example, a dielectric constant from about 2 to 100 or even higher is known for a gate dielectric. Useful materials for the gate dielectric may comprise, for example, an inorganic electrically insulating material. The gate dielectric may comprise a plurality of layers of different materials having different dielectric constants.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred. The gate dielectric is preferably deposited by the same ALD method used to deposit the semiconducting layer. The gate dielectric can be provided in the TFT as a separate layer, or formed on the gate such as by oxidizing the gate material to form the gate dielectric. The dielectric layer may comprise two or more layers having different dielectric constants. Such insulators are discussed in U.S. Pat. No. 5,981,970, hereby incorporated by reference and copending US Application Publication No. 2006/0214154, hereby incorporated by reference. Gate insulator materials typically exhibit a band-gap of greater than about 5 eV.

The thickness of the gate insulator layer may vary, and according to particular examples it can range from about 10 to about 300 nm. The gate dielectric layer may be introduced into the structure by techniques such as chemical vapor deposition, sputtering, atomic layer deposition, or evaporation, solution.

Source/drain terminals refer to the terminals of a TFT, between which conduction occurs under the influence of an electric field. Designers often designate a particular source/drain terminal to be a "source" or a "drain" on the basis of the voltage to be applied to that terminal when the TFT is operated in a circuit.

The source electrode and drain electrode are separated from the gate electrode by at least the gate dielectric, while the zinc-oxide-based semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, copper, tungsten, polyaniline, PEDOT:PSS, other conducting polymers, alloys thereof, combinations thereof, and multilayers thereof. Other illustrative materials include transparent, n-type conductors such as indium-tin oxide (ITO), ZnO, $SnO_2$, or $In_2O_3$. Preferred electrodes are silver, gold, PEDOT:PSS, or aluminum.

The source electrode and drain electrode can be provided by any useful means such as chemical or physical vapor deposition (e.g., thermal evaporation, sputtering), evaporation, ink jet printing, or doping of the semiconductor channel layer material via diffusion or ion implantation and solution deposition. In a preferred embodiment of the present invention the source and drain electrodes comprise a conducting oxide or metal and are deposited by the same ALD method used to deposit the semiconductor layer. Patterning of these electrodes can be accomplished by known methods such as shadow masking, additive photolithography, subtractive photolithography, printing, microcontact printing, and pattern coating. The source and drain terminals may be fabricated such that they are geometrically symmetrical or non-symmetrical.

Electrical contact to the gate electrode, source, drain and substrate may be provided in any manner. For example, metal lines, traces, wires, interconnects, conductors, signal paths, and signaling mediums may be used for providing the desired electrical connections. The related terms listed above, are generally interchangeable, and appear in order from specific to general. Metal lines, generally aluminum (Al), copper (Cu), or an alloy of Al and Cu, are typical conductors that provide signal paths for coupling or interconnecting, electrical circuitry. Conductors other than metal may also be utilized.

In cases where another layer covers the electrical contact of interest, connection to the electrical contact can be made by creating a "via" that penetrates to the contact. Such vias can be made by convenient patterning operations such as lithography, etching, or laser based processes.

An illustrative n-channel operation of the transistor involves applying a positive voltage to the gate electrode, grounding the source, and applying a positive voltage to the drain. For example, a voltage of about 5 to about 40 V may be applied to the gate electrode and the drain during operation. The threshold voltage may range from about—minus 10 to about 20 V, although devices can operate with larger ranges. Electrons flow from the source, along the semiconductor thin film, and out of the transistor through the drain. The effective mobility of the electrons may vary depending upon the specific structure, but typically should be greater than 0.01 $cm^2V^{-1}s^{-1}$ for useful practical applications. Simply by removing the positive voltage applied to the gate electrode turns the transistor off when the transistor is an enhancement-mode transistor.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in combination with other transistors made using available p-type organic semiconductor materials such as pentacene. In an active matrix display, a transistor according to the present invention can be used as part of voltage hold circuitry of a pixel of the display. In devices containing the TFTs, such TFTs are operatively connected by means known in the art.

One example of a microelectronic device is an active-matrix liquid-crystal display (AMLCD). One such device is an optoelectronic display that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD). The presently detailed transistor has sufficient current carrying capacity for switching the display element at such a high frequency that the use of the transistor as a switching element in a liquid crystal display is possible. The display element acts in electrical terms as a capacitor that is charged or discharged by the accompanying transistor. The optoelectronic display device may include many display elements each with its own transistor, for example, arranged in a matrix. Certain active matrix pixel designs, especially those supplying a display effect that is current driven, may require several transistors and other electrical components in the pixel circuit.

Figure 24:
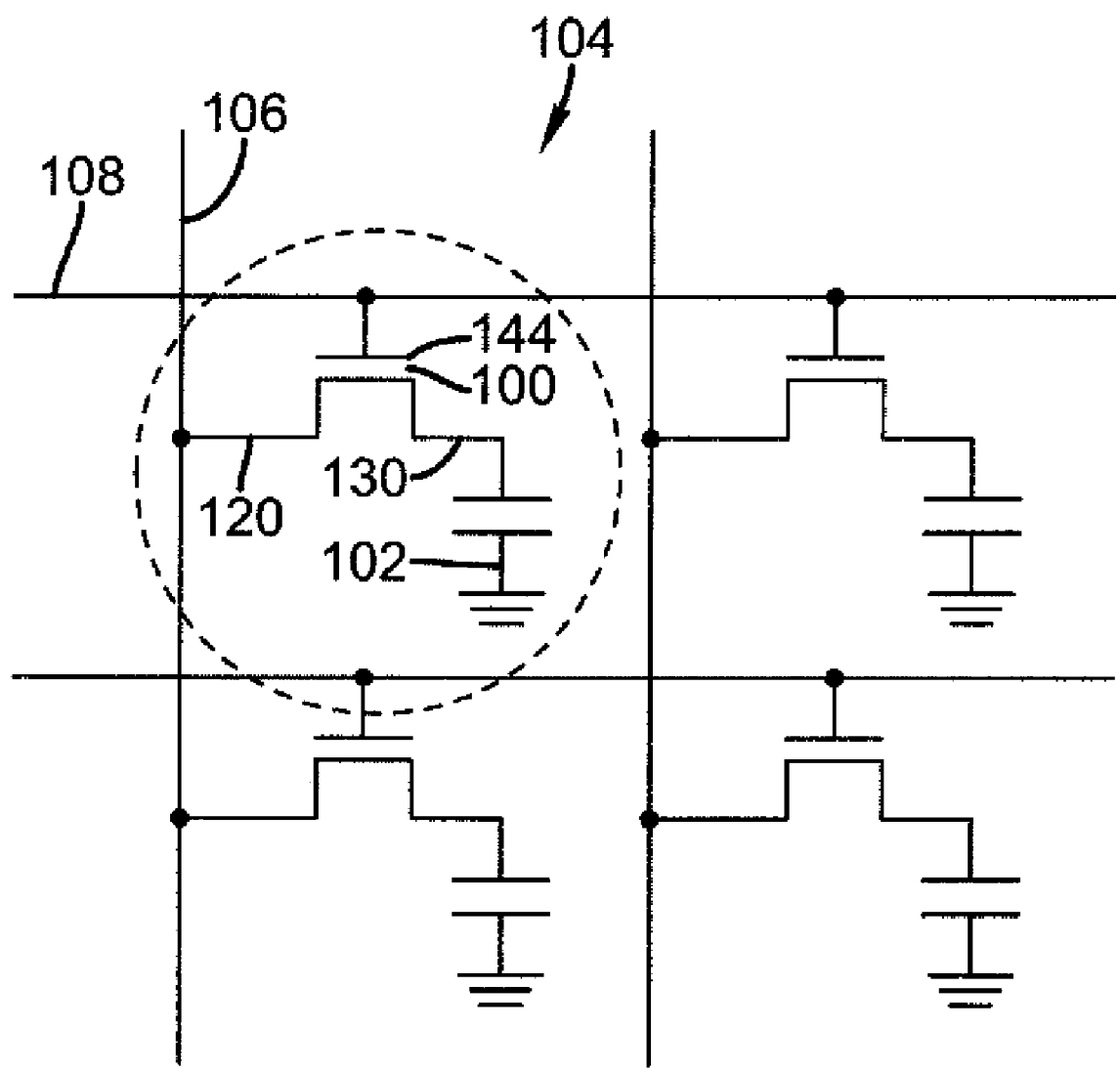
FIG. 24 illustrates a typical active matrix pixel design comprising a select transistor and capacitor representing the capacitance due to display design.

One specific example of a basic AMLCD cell circuit is depicted in FIG. 24. The AMLCD cell circuit includes a transistor 100 as presently described, and an LCD pixel 102 electrically coupled thereto. The transistor 100 and the LCD pixel 102 together form a transistor/pixel cell 104. In the arrangement shown, the transistor 100 is electrically coupled to the LCD pixel 102 via the drain electrode 130. The gate electrode 144 of the transistor 100 is electrically coupled to a row or control line 108 (also referred to as a select or gate line) that receives on/off input for the transistor 100. The source electrode 120 of the transistor 100 is electrically coupled to a column or data line 106 that receives a signal for controlling the LCD pixel 102. Each LCD pixel 102 can also be viewed as a capacitor representing the capacitance according to display design.

Figure 25:
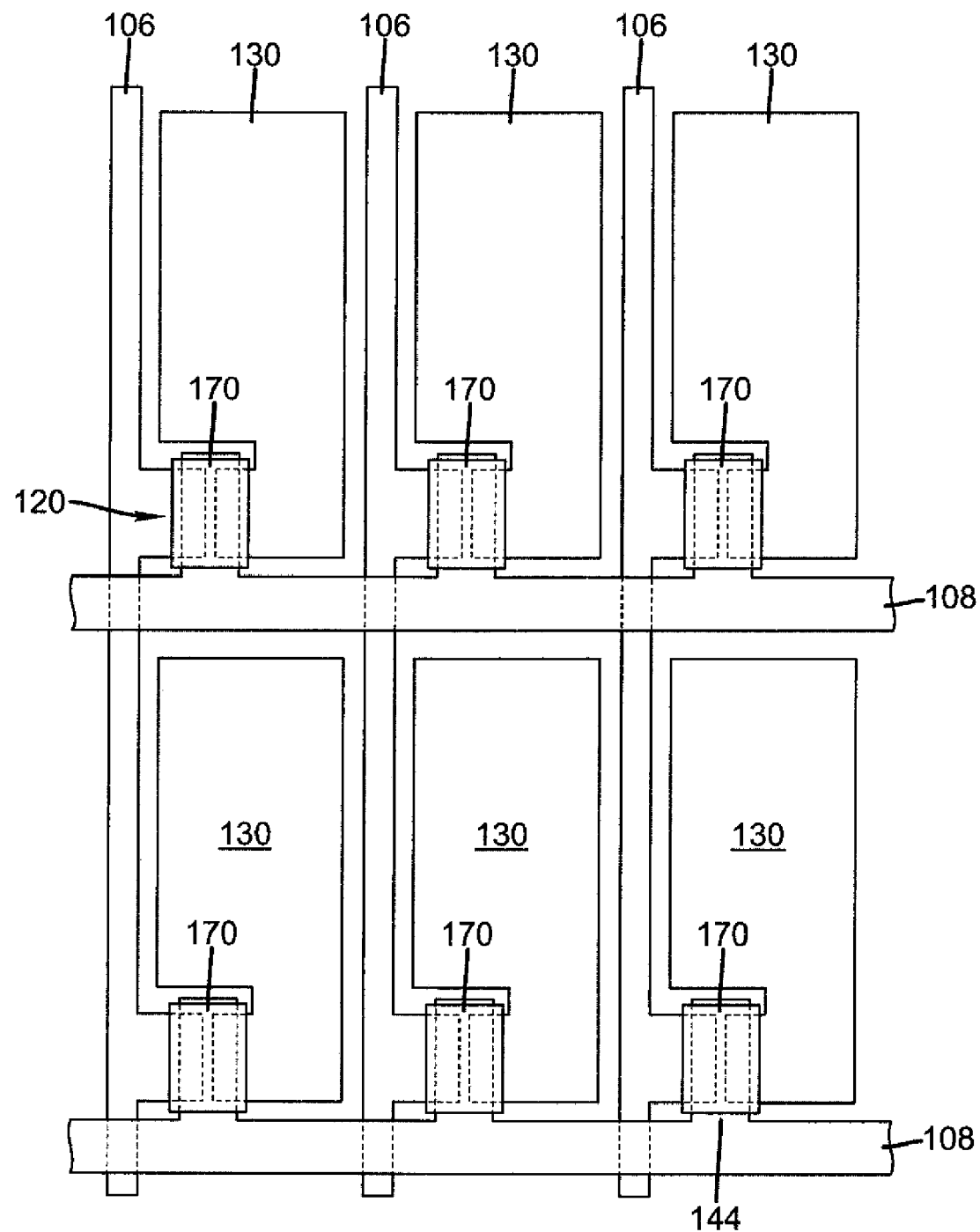
FIG. 25 illustrates a typical pixel layout comprising data lines, control lines, thin film transistors, and pixel conductor pads.

FIG. 25 shows a typical pixel layout in which data lines 106 lead to individual source electrodes 120, control lines 108 lead to individual gate electrodes 144, semiconductors 170, and drain electrodes 130 each forming a pixel conductor pad.

EXAMPLES

Description of the Coating Apparatus

Figure 18:
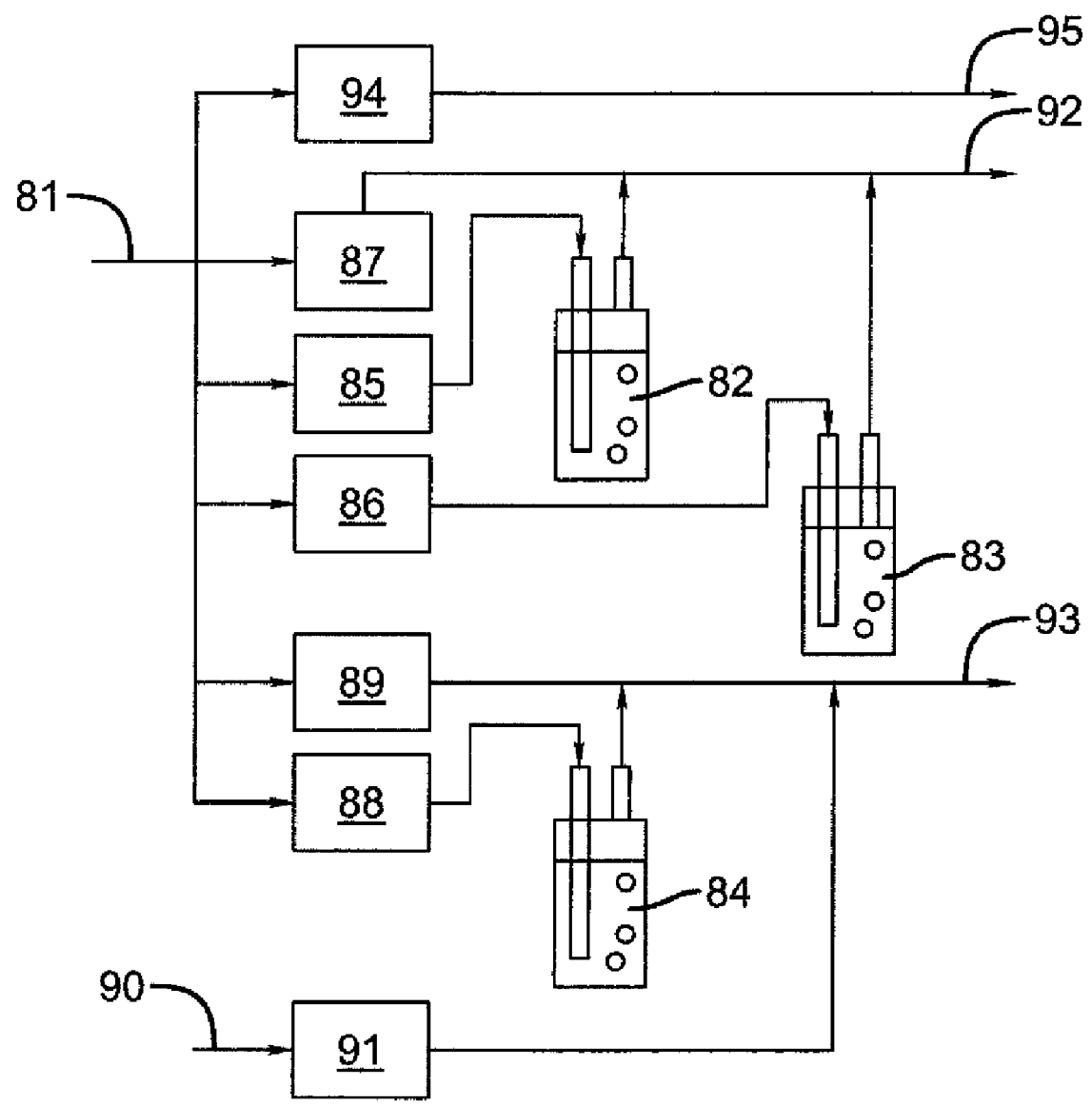
FIG. 18 is a block diagram of the source materials for a thin film deposition process according to the Examples.

All of the following thin film examples employ a flow setup as indicated in FIG. 18. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; nitrogen purge flow 95 composed only of the inert gas. The composition and flows of these streams are controlled as described below.

Gas bubbler 82 contains diethylzinc. Gas bubbler 83 contains trimethylaluminum. Both bubblers are kept at room temperature. Flow meters 85 and 86 deliver flows of pure nitrogen to the diethylzinc bubbler 82 and trimethylaluminum bubbler 83, respectively. The output of the bubblers now contain nitrogen gas saturated with the respective precursor solutions. These output flows are mixed with a nitrogen gas dilution flow delivered from flow meter 87 to yield the overall flow of metal precursor flow 92. In the following examples, the flows will be as follows:

| Flow meter 85: | To Diethylzinc Bubbler Flow |
| Flow meter 86: | To Trimethylaluminum Bubbler Flow |
| Flow meter 87: | To Metal Precursor Dilution Flow |

Gas bubbler 84 contains pure water for the control (or ammonia in water for the inventive example) at room temperature. Flow meter 88 delivers a flow of pure nitrogen gas to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water composition, ammonia composition, oxygen composition, and total flow. In the following examples, the flows will be as follows:

| Flow meter 88: | To Water Bubbler |
| Flow meter 89: | To Oxidizer Dilution Flow |
| Flow meter 91: | To Air Flow |

Flow meter 94 controls the flow of pure nitrogen that is to be delivered to the coating apparatus.

Figure 19:
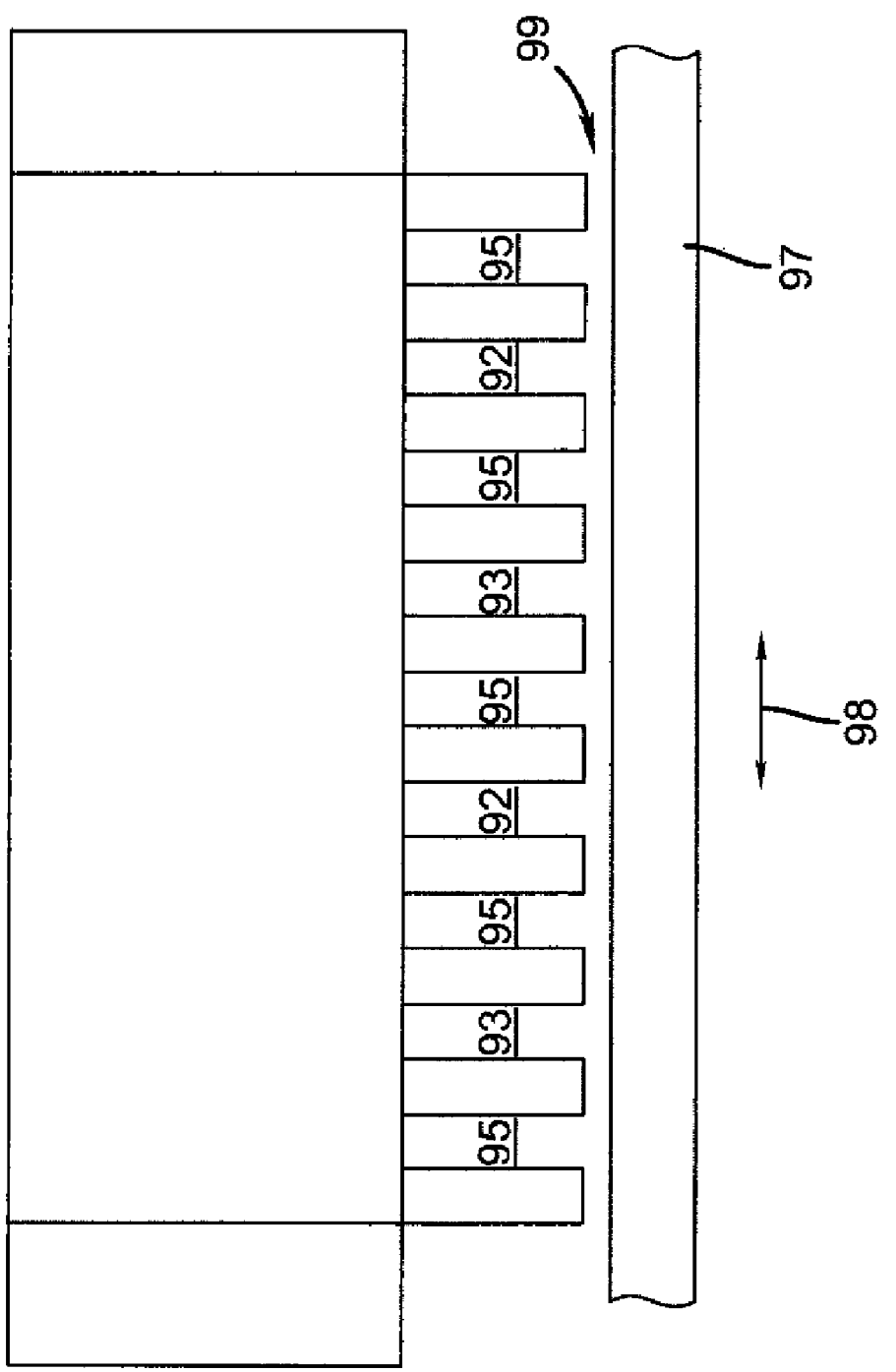
FIG. 19 is a cross-sectional side view of a deposition device used in the present process, showing the arrangement of gaseous materials provided to a substrate that is subject to thin film deposition process of the Examples.

Streams or Flows 92, 93, and 95 are then delivered to an atmospheric pressure coating head where they are directed out of the channels or microchamber slots as indicated in FIG. 19. A gap 96 of approximately 0.15 mm exists between the elongated channels and the substrate 97. The microchambers are approximately 2.5 mm tall, 0.86 mm wide, and run the length of the coating head, which is 76 mm. The reactant materials in this configuration are delivered to the middle of the slot and flow out of the front and back.

In order to perform a deposition, the coating head is positioned over a portion of the substrate and then moved in a reciprocating fashion over the substrate, as represented by the arrow 98. The length of the reciprocation cycle was 32 mm. The rate of motion of the reciprocation cycle is 30 mm/sec.

The following characterization is used:

Description of Transistor Measurement and Analysis

Transistor characterization of the devices fabricated using the present invention was performed with a Hewlett Packard HP 4156 parameter analyzer. Device testing was done in air in a dark enclosure.

The results were typically averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. For most devices, Vg was swept from −10 V to 20 V with the drain voltage held at 20V.

Parameters extracted from the data include field-effect mobility ($\mu$), threshold voltage (Vth), and the ratio of Ion/Ioff for the measured drain current. These measurements can be taken without any protective film on the semiconductor thin film, yielding substantially the same results with or without the protective film. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where, W and L are the channel width and length, respectively, and $C_{ox}$ is the capacitance of the dielectric layer, which is a function of dielectric thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

The log of the drain current as a function of gate voltage was plotted. Parameters extracted from the log $I_d$ plot include the $I_{on}/I_{off}$ ratio. The $I_{on}/I_{off}$ ratio is simply the ratio of the maximum to minimum drain current. For the purpose of the claimed invention, the on/off ratio is measured by the ratio of the on current, defined as the drain current at a gate voltage of 10 V in excess of the threshold voltage, to the off current, defined as the drain current at a gate voltage for which the transistor is in an off state. The measurements in the present examples were taken in excess of 10V which would result in minor changes to the measurement.

in place by a vacuum assist and heated to 200° C. The platen with the glass substrate was positioned under the coating head that directs the flow of the active precursor gasses. The spacing between the ITO substrate and the coating head was adjusted using a micrometer to 30 microns.

The coating head has isolated channels through which flow: (1) inert nitrogen gas; (2) a mixture of nitrogen, and water vapor; and (3) a mixture of active metal alkyl vapor ($Me_3Al$ or $Et_2Zn$) in nitrogen. The flow rate of the active metal alkyl vapor was controlled by bubbling nitrogen through the pure liquid ($Me_3Al$ or $Et_2Zn$) contained in an airtight bubbler by means of individual mass flow control meters. The flow of water vapor was controlled by adjusting the bubbling rate of nitrogen passed through pure water in a bubbler. The temperature of the coating head was maintained at 40° C. Adjusting the flow rates of the individual gasses to the settings shown in Table 1 below, the coating process was initiated by oscillating the coating head across the substrate for the number of cycles specified. Electrical test results for the above device (sample 1) having ITO gate electrode and ALD-coated dielectric, semiconductor and protective layers are shown below in Table 2.

TABLE 1

| Sample | Layer | $Me_3Al$* | $Et_2Zn$* | $Me_3In$* | Water | Water/ Ammonia** | $N_2$ carrier with Metal Alkyl | $N_2$ carrier for water | $N_2$ Inert Purge | Cycles | Substrate Temp.° C. |
|---|---|---|---|---|---|---|---|---|---|---|---|
| 1, 2, 3 | $Al_2O_3$ dielectric | 4 | 0 | 0 | 15 | 0 | 45 | 90 | 644 | 330 | 200 |
| 1, 2, 3 | ZnO 200 Å | 0 | 13 | 0 | 0 | 15 | 45 | 90 | 644 | 62 | 240 |
| 2, 3 | In-Doped ZnO 200 Å | 0 | 13 | 40 | 15 | 0 | 45 | 90 | 644 | 600 | 240 |
| 1, 1, 3 | $Al_2O_3$ protection | 4 | 0 | 0 | 15 | 0 | 45 | 90 | 644 | 55 | 200 |

All flow values in sccm (standard cubic centimeters/min)
**29% $NH_3$ by weight in water Materials Used:

(1) Conductive ITO substrate (100 nm thick on soda lime glass, commercially available from MBC, product #255.

(2) $Me_3Al$ (commercially available from Aldrich Chemical Co.).

(3) $Et_2Zn$ (commercially available from Aldrich Chemical Co.).

(4) Ammonium Hydroxide [aqueous ammonia], (reagent grade, ~29 weight % ammonia, commercially available from J. T. Baker Chemical Co.).

Example 1

The purpose of this example was to prepare a TFT device with dielectric, semiconductor, and protection layers prepared by the ALD coating apparatus described above. This thin film transistor device (TFT) is comprised of a glass substrate, an ITO (indium tin oxide) gate electrode, a 1100 Å thick $Al_2O_3$ dielectric layer, a 200 Å thick ZnO layer, evaporated Al metal source/drain electrodes, and a 200 Å $Al_2O_3$ protection layer. The device used to prepare the $Al_2O_3$ and ZnO layers has been described in detail in FIGS. 5 to 12 herein. A 2.5×2.5 inch square (62.5 mm square) piece of ITO coated glass was positioned on the platen of this device, held Example 2

The purpose of this example was to prepare a TFT device that had a transparent, conductive gate electrode of In-doped ZnO prepared by the same ALD coating system used for the dielectric and semiconductor layers. The devices had the following cross sectional composition: glass substrate/In-doped ZnO gate electrode/Al2O3 dielectric/ZnO semiconductor/Al source and drain electrodes. The In-doped ZnO gate electrode, layer 7A, was prepared as for the ZnO semiconductor layer, except that a flow of trimethylindium vapor is added to the flow of diethyl zinc at a flow rate of 40 sccm, and the layer was grown to approximately 2000 Å thick. The resistivity of the In-doped ZnO gate electrode layer was measured to be 3.3E-02 ohm*cm. An $Al_2O_3$ dielectric layer (7B) and a ZnO semiconductor layer (7C) were then coated onto the top of layer 7A using the settings specified in Table 1. Aluminum source and drain contacts were evaporated onto the top of layer 7C through a shadow mask, yielding thin film transistors with channel lengths of 50, 100 or 150 μm and a channel width of 600 μm. A photolithographic process was used to isolate devices on the substrate, producing islands of ZnO. Electrical test results for the above device (sample 2) having the In-doped ZnO gate electrode are shown below in Table 2.

Example 3

The purpose of this example was to prepare a TFT device that had a transparent, conductive gate electrode of In-doped ZnO prepared by the same ALD coating system used for the dielectric, semiconductor, and protection layers. The devices had the following cross sectional composition: glass substrate/In-doped ZnO gate electrode/$Al_2O_3$ dielectric/ZnO semiconductor/Al source and drain electrodes/$Al_2O_3$ protection layer. The sample was prepared as for Example 2 and electrically tested, and subsequently the protective layer was applied using the ALD coating system and the conditions listed for the protection layer in Table 1 above. The sample was then electrically tested again. Electrical test results for the above device (sample 3) having the In-doped ZnO gate electrode are shown below in Table 2 and are compared to a those of sample 2, which was identical except that it had no protection layer.

TABLE 2

| Sample | Average Mobility (cm$^2$/Vs) | Average $I_{on}/I_{off}$ |
|---|---|---|
| 1 (Devices with ITO gate electrode, and ALD-deposited dielectric, semiconductor, and protection layers) | 5.3 | $4 \times 10^8$ |
| 2 (Devices with ALD-deposited gate electrode, dielectric, and semiconductor layers) | 5.0 | $6 \times 10^8$ |
| 3 (Devices with ALD-deposited gate electrode, dielectric, semiconductor and protection layers) | 4.9 | $8 \times 10^7$ |

The data in Table 2 demonstrate that the devices all function well as field effect transistors, with mobility of order 5 cm$^2$/Vs and current on/off ratios in excess of $1\times10^7$. The data for samples 2 and 3 show in addition that the InZnO layer produced on the atmospheric pressure atomic layer deposition device in this work is sufficiently conductive so that it functions well as a gate electrode in a TFT device.

PARTS LIST

1 continuous supply of gaseous materials for system
2 first channel flow of first molecular precursor over channel area of substrate
3 relative movement of substrate and multi-channel flows
4 second channel flow with inert gas over channel area
5 relative movement of substrate and multi-channel flows
6 third channel flow of second molecular precursor over channel area
7 relative movement of substrate and multi-channel flows
8 fourth channel flow with inert gas over channel area
9 relative movement of substrate and multi-channel flow
10 deposition device
11 multiple channel flow in parallel
12 output channel
14, 16, 18 gas inlet port
15 sequence
20 substrate
21b, 21c, 21d portion of substrate
22 partition
24 gas output port
26 exhaust port
28a, 28b, 28c gas supply
30 actuator
32 supply line
36 output face
38 redirecting plate
40 aperture
42 partition plate
44 delivery plate
46a, 46b, 46c duct
48 redirecting chamber
50 chamber
52 transport motor
54 transport subsystem
56 control logic processor
58 baffle
60 Atomic Layer Deposition (ALD) process
62 web conveyor
64 deposition device transport
66 web substrate
70 Atomic Layer Deposition (ALD) process
72 diffusion layer
74 substrate support
81 nitrogen gas flow
82, 83, 84 gas bubbler
85, 86, 87, 88, 89 flow meter
90 air flow
91 flow meter
92 metal precursor flow
93 oxidizer-containing flow
94 flow meter
95 nitrogen purge flow
96 gap
97 example substrate
98 arrow
100 transistor
102 LCD pixel
104 transistor/pixel cell
106 column or data line
108 row or control line
120 source electrode
128 substrate
130 drain electrode
144 gate electrode
156 gate dielectric
170 semiconductor
175 protective layer
200 entrance section
202a, 202b entrance section module
202c, 202d entrance section module
220 coating section
222a, 222b coating section module
222c, 222d, 222e coating section module
232a module adapted for first thin film material
232b module adapted for second thin film material
232c module adapted for third thin film material
240 exit section
252 output opening
254 exhaust port
332a thin film of first thin film material
332b thin film of second thin film material
332c thin film of third thin film material
D distance
F1, F2, F3, F4 gas flow
$F_I$, $F_O$, $F_M$, $F_E$ gas flow H channel height
I inert gaseous material
L channel length
M second reactant gaseous material
O first reactant gaseous material
R arrow
W channel width
XX distance

The invention claimed is:

1. A process of making a thin film transistor comprising at least five layers including a gate layer, a dielectric layer, a channel layer, a source-drain layer, and a protective layer, wherein at least three of the five layers are grown on a substrate by an atomic layer deposition process that is carried out substantially at or above atmospheric pressure, wherein the temperature of the substrate during deposition is under 300° C., and wherein the atomic layer deposition process comprises simultaneously directing a series of gas flows comprising, in order, at least a first reactive gaseous material, an inert purge gas, and a second reactive gaseous material through a plurality of output openings spaced apart from the substrate, and transporting the substrate in a direction relative to the plurality of output openings, and such that any point on the substrate experiences a sequence of the first, the second and the third gaseous materials and whereby the sequence causes a layer to be formed by atomic layer deposition, wherein the atomic layer deposition is carried out using a deposition system that comprises a delivery head and a means for maintaining a substantially uniform distance between the depositing output face of a delivery head and a surface of the substrate during thin film deposition, wherein the delivery head is designed to provide flows of one or more of the gaseous materials to the surface of the substrate for thin film deposition that also provides at least part of a force separating the depositing output face of the delivery head from the surface of the substrate, wherein the deposition system optionally includes an entrance section or an exit section that comprises a non-depositing output face having a plurality of non-depositing output openings designed to provide gas flow of non-reactive gas to the surface of the substrate during at least part of the passage through the deposition system.

2. The process of claim 1 wherein, during the deposition of the channel layer, the first reactive gaseous material is a volatile organo-zinc precursor compound comprising both zinc and organic groups, to produce a zinc-oxide-based thin film semiconductor.

3. The process of claim 2 wherein a volatile acceptor dopant precursor is introduced into the first reactive gaseous material, the second reactant gaseous material, the inert purge gas, or an additional gas flow of a supplemental gaseous material during formation of the channel layer, whereby the volatile acceptor dopant precursor reacts and is incorporated as an acceptor dopant in an n-type zinc-oxide-based thin film semiconductor.

4. The process of claim 3 wherein the volatile acceptor dopant precursor comprises an element selected from the group consisting of N, P, As, Li, Na, K, Cu, Ag, or mixtures thereof.

5. The process of claim 3 wherein the volatile acceptor dopant precursor comprises nitrogen in the form of NO, $N_2O$, $NO_2$, or ammonia.

6. The process of claim 1 wherein the gate layer, the dielectric layer for the gate layer, the channel layer, the source-drain layer, and the protective layer are grown by the atomic layer deposition process.

7. The process of claim 1 wherein the dielectric layer, the channel layer, and the protective layer are grown by the atomic layer deposition process.

8. The process of claim 1 wherein the gate layer, the dielectric layer, the channel layer, and the protective layer are grown by the atomic layer deposition process.

9. The process of claim 1 wherein at least three of said five layers are oxide layers.

10. The process of claim 1 wherein the gate layer is grown by the atomic layer deposition process and the gate layer is zinc oxide doped with an element selected from iridium, aluminum, boron, and fluorine.

11. The process of claim 1 wherein the source-drain layer is grown by the atomic layer deposition process and the source-drain layer is zinc oxide doped with an element selected from indium, aluminum, boron, and fluorine.

12. The process of claim 1 wherein the gate layer is grown by the atomic layer deposition process and the gate layer is a metal and wherein the source-drain layer is grown by the atomic layer deposition process and the source-drain layer is a metal.

13. The process of claim 1 wherein the series of gas flows are provided by a deposition device comprising, facing the substrate in plan view, a series of open elongated output openings, in parallel, positioned to the substrate in close proximity thereto, in an output face of the deposition device, which output face is spaced within 1 mm from a substrate surface subject to deposition.

14. The process of claim 13 wherein a given area of the substrate is exposed to a gas flow in a channel for less than 100 milliseconds and wherein relative movement of the substrate to the deposition device is at a speed at least 0.1 cm/sec.

15. The process of claim 13 wherein the deposition device further comprises exhaust openings between substantially parallel elongated output openings for the first and the second reactive gaseous materials.

16. The process of claim 15 wherein the flows of one or more of the gaseous materials to the substrate surface for thin film deposition provides at least part of a force separating the depositing output face of a delivery head from the substrate surface.

17. The process of claim 1 wherein the substrate or a support for the substrate comprises a moving web, wherein a support maintains a surface of the substrate at a separation distance of within 0.3 mm of an output face of a deposition device.

18. The process of claim 1 wherein the deposition system further comprises:

(A) an entrance section;
(B) a coating section comprising:
  (i) a plurality of sources for, respectively, a plurality of gaseous materials comprising at least a first, a second, and a third source for a first, a second, and a third gaseous material, respectively;
  (ii) a delivery head for delivering the plurality of gaseous materials to a substrate receiving thin film deposition, the delivery head comprising:
    (a) a plurality of inlet ports comprising at least a first, a second, and a third inlet port for receiving the first, the second, and the third gaseous material, respectively; and
    (b) a depositing output face separated a distance from the substrate and comprising a plurality of substantially parallel elongated output openings for each of the first, the second, and the third gaseous materials, wherein the delivery head is designed to deliver the first, the second, and the third gaseous materials simultaneously from the output openings in the depositing output face;
(C) an exit section; and
(D) means for moving the substrate in a unidirectional passage through the coating section.

19. The process of claim 18 wherein the coating section is composed of a plurality of deposition modules, wherein each deposition module in the plurality of modules at least partially contributes to a deposition function of the coating section, and wherein optionally the entrance section and/or the exit section is composed of a plurality of non-deposition modules, wherein each non-deposition module in the plurality of non-deposition modules at least partially contributes to a conveyance and/or optional physical-treatment function of the entrance or the exit section, respectively.

20. The process of claim 19 wherein the coating section is composed of at least a first and a second deposition module and wherein the first deposition module forms a thin film of a composition differing from that formed by the second deposition module.

21. The process of claim 1 wherein the process is used to make a semiconductor in a thin film transistor, wherein a thin film comprises a zinc-oxide-based material, the process comprising forming on a substrate, at a temperature of 300° C. or less, at least one layer of a zinc-oxide-based material, wherein the zinc-oxide-based material is a reaction product of at least two reactive gases, a first reactive gas comprising an organozinc precursor compound and a second reactive gas comprising a reactive oxygen-containing gaseous material, and wherein the process further comprises forming a spaced apart source electrode and drain electrode, wherein the source electrode and the drain electrode are separated by, and electrically connected with, the n-type zinc-oxide-based thin film semiconductor; and forming a gate electrode spaced apart from the n-type zinc-oxide-based thin film semiconductor.

22. The process of claim 21 comprising, not necessarily in order, the following steps:
providing the substrate;
providing a gate electrode material over the substrate;
providing a dielectric layer over the gate electrode material;
forming the n-type zinc-oxide-based thin film semiconductor over the gate dielectric; and
providing a source electrode and a drain electrode contiguous to the n-type zinc-oxide-based thin film semiconductor.

23. A process of making a thin film transistor comprising a substrate, a gate electrode, a gate dielectric, a semiconductor, a protective layer and a source electrode and a drain electrode, wherein the gate dielectric, the semiconductor and at least one of the protective layer, the gate electrode or the source and the drain electrodes are each formed by a process wherein the deposition process is an atomic layer deposition (ALD) process that is carried out substantially at or above atmospheric pressure, wherein the temperature of the substrate during deposition is under 300° C., and wherein the ALD process comprises simultaneously directing a series of gas flows comprising, in order, at least a first reactive gaseous material, an inert purge gas, and a second reactive gaseous material through a plurality of output openings spaced apart from the substrate, and transporting the substrate in a direction relative to a plurality of output openings, and such that any point on the substrate experiences a sequence of the first, the second and the third gaseous materials and whereby the sequence causes a layer to be formed by atomic layer deposition,
wherein the atomic layer deposition is carried out using a deposition system that comprises delivery a means for maintaining a substantially uniform distance between the depositing output face of the delivery head and a surface of the substrate during thin film deposition, wherein the delivery head is designed to provide flows of one or more of the gaseous materials to the surface of the substrate for thin film deposition that also provides at least part of a force separating the depositing output face of the delivery head from the surface of the substrate, wherein the deposition system optionally includes an entrance section or an exit section that comprises a non-depositing output face having a plurality of non-depositing output openings designed to provide gas flow of non-reactive gas to the surface of the substrate during at least part of the passage through the deposition system.

* * * * *

UNITED STATES PATENT AND TRADEMARK OFFICE
CERTIFICATE OF CORRECTION

PATENT NO. : 7,851,380 B2
APPLICATION NO. : 11/861491
DATED : December 14, 2010
INVENTOR(S) : Nelson et al.

It is certified that error appears in the above-identified patent and that said Letters Patent is hereby corrected as shown below:

In Column 40, line 11, delete "iridium," and insert -- indium, --.

In Column 42, line 26, delete "comprises delivery a means" and insert -- "comprises a delivery head and a means --.

Signed and Sealed this
Nineteenth Day of March, 2013

Teresa Stanek Rea
*Acting Director of the United States Patent and Trademark Office*